US010750304B2

(12) United States Patent
McPherson et al.

(10) Patent No.: US 10,750,304 B2
(45) Date of Patent: *Aug. 18, 2020

(54) CALIBRATION OF AUDIO PLAYBACK DEVICES

(71) Applicant: Sonos, Inc., Santa Barbara, CA (US)

(72) Inventors: Patrick McPherson, Somerville, MA (US); Shao-Fu Shih, Boston, MA (US); Klaus Hartung, Santa Barbara, CA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/416,593

(22) Filed: May 20, 2019

(65) Prior Publication Data

US 2019/0320278 A1 Oct. 17, 2019

Related U.S. Application Data

(63) Continuation of application No. 16/056,862, filed on Aug. 7, 2018, now Pat. No. 10,299,054, which is a (Continued)

(51) Int. Cl.

*H04R 29/00* (2006.01)
*H03G 3/20* (2006.01)

(Continued)

(52) U.S. Cl.

CPC ........... *H04R 29/007* (2013.01); *H04R 27/00* (2013.01); *H04S 7/301* (2013.01); *H04R 2227/005* (2013.01)

(58) Field of Classification Search

CPC .............. H04R 2227/005; H04R 27/00; H04R 29/007; H04R 2227/001; H04R 2227/003;

(Continued)

(56) References Cited

U.S. PATENT DOCUMENTS

| | | | |
|---|---|---|---|
| 4,306,113 | A | 12/1981 | Morton |
| 4,342,104 | A | 7/1982 | Jack |

(Continued)

FOREIGN PATENT DOCUMENTS

| | | | |
|---|---|---|---|
| CN | 1447624 | A | 10/2003 |
| CN | 101366177 | A | 2/2009 |

(Continued)

OTHER PUBLICATIONS

Notice of Allowance dated Dec. 7, 2015, issued in connection with U.S. Appl. No. 14/216,325, filed Mar. 17, 2014, 7 pages.

(Continued)

*Primary Examiner* — Khai N. Nguyen
(74) *Attorney, Agent, or Firm* — McDonnell Boehnen Hulbert & Berghoff LLP

(57) ABSTRACT

An audio playback device comprises a microphone, a speaker, and a processor. The processor is arranged to output by the speaker first audio content and receive by the microphone an indication of the first audio content. A first acoustic response of a room in which the audio playback device is located is determined based on the received indication of first audio content. A mapping is applied to the first acoustic response to determine a second acoustic response. The second acoustic response is indicative of an approximated acoustic response of the room at a spatial location different from a spatial location of the microphone. The second audio content output by the speaker is adjusted based on the second response.

20 Claims, 10 Drawing Sheets

Related U.S. Application Data continuation of application No. 15/698,283, filed on Sep. 7, 2017, now Pat. No. 10,045,142, which is a continuation of application No. 15/096,827, filed on Apr. 12, 2016, now Pat. No. 9,763,018.

(51) Int. Cl.
*H04S 7/00* (2006.01)
*H04R 27/00* (2006.01)

(58) Field of Classification Search
CPC ...... H04R 29/001; H04R 29/008; H04R 3/04; H04R 3/12; H04R 5/04; H04R 1/22; H04R 1/323; H04R 2420/03; H04R 2420/07; H04R 2430/03; H04R 2499/13; H04R 2499/002; G06F 3/165; H04S 7/301; H04S 1/007; H04S 2400/01; H04S 2420/07; H04S 7/303; H04S 7/307; G05B 15/02; H03G 3/20; H03G 5/005; H03G 5/16; H03G 5/165
USPC ............................................... 381/56, 58, 59
See application file for complete search history.

(56) References Cited

U.S. PATENT DOCUMENTS 4,504,704 A 3/1985 Ohyaba et al.
4,592,088 A 5/1986 Shimada
4,628,530 A 12/1986 Op De Beek et al.
4,631,749 A 12/1986 Rapaich
4,694,484 A 9/1987 Atkinson et al.
4,773,094 A 9/1988 Dolby
4,995,778 A 2/1991 Bruessel
5,218,710 A 6/1993 Yamaki et al.
5,255,326 A 10/1993 Stevenson
5,323,257 A 6/1994 Abe et al.
5,386,478 A 1/1995 Plunkett
5,440,644 A 8/1995 Farinelli et al.
5,553,147 A 9/1996 Pineau
5,581,621 A 12/1996 Koyama et al.
5,757,927 A 5/1998 Gerzon et al.
5,761,320 A 6/1998 Farinelli et al.
5,910,991 A 6/1999 Farrar
5,923,902 A 7/1999 Inagaki
5,939,656 A 8/1999 Suda
6,018,376 A 1/2000 Nakatani
6,032,202 A 2/2000 Lea et al.
6,072,879 A 6/2000 Ouchi et al.
6,111,957 A 8/2000 Thomasson
6,256,554 B1 7/2001 DiLorenzo
6,363,155 B1 3/2002 Horbach
6,404,811 B1 6/2002 Cvetko et al.
6,469,633 B1 10/2002 Wachter et al.
6,522,886 B1 2/2003 Youngs et al.
6,573,067 B1 6/2003 Dib-Hajj et al.
6,611,537 B1 8/2003 Edens et al.
6,631,410 B1 10/2003 Kowalski et al.
6,639,989 B1 10/2003 Zacharov et al.
6,643,744 B1 11/2003 Cheng
6,704,421 B1 3/2004 Kitamura
6,721,428 B1 4/2004 Allred et al.
6,757,517 B2 6/2004 Chang et al.
6,760,451 B1 7/2004 Craven et al.
6,766,025 B1 7/2004 Levy et al.
6,778,869 B2 8/2004 Champion
6,798,889 B1 9/2004 Dicker et al.
6,862,440 B2 3/2005 Sampath
6,916,980 B2 7/2005 Ishida et al.
6,931,134 B1 8/2005 Waller, Jr. et al.
6,985,694 B1 1/2006 De Bonet et al.
6,990,211 B2 1/2006 Parker
7,039,212 B2 5/2006 Poling et al.
7,058,186 B2 6/2006 Tanaka
7,072,477 B1 7/2006 Kincaid
7,103,187 B1 9/2006 Neuman
7,130,608 B2 10/2006 Hollstrom et al.
7,130,616 B2 10/2006 Janik
7,143,939 B2 12/2006 Henzerling
7,187,947 B1 3/2007 White et al.
7,236,773 B2 6/2007 Thomas
7,289,637 B2 10/2007 Montag et al.
7,295,548 B2 11/2007 Blank et al.
7,312,785 B2 12/2007 Tsuk et al.
7,391,791 B2 6/2008 Balassanian et al.
7,477,751 B2 1/2009 Lyon et al.
7,483,538 B2 1/2009 McCarty et al.
7,483,540 B2 1/2009 Rabinowitz et al.
7,489,784 B2 2/2009 Yoshino
7,490,044 B2 2/2009 Kulkarni
7,492,909 B2 2/2009 Carter et al.
7,519,188 B2 4/2009 Berardi et al.
7,529,377 B2 5/2009 Nackvi et al.
7,571,014 B1 8/2009 Lambourne et al.
7,590,772 B2 9/2009 Marriott et al.
7,630,500 B1 12/2009 Beckman et al.
7,630,501 B2 12/2009 Blank et al.
7,643,894 B2 1/2010 Braithwaite et al.
7,657,910 B1 2/2010 McAulay et al.
7,664,276 B2 2/2010 McKee
7,676,044 B2 3/2010 Sasaki et al.
7,689,305 B2 3/2010 Kreifeldt et al.
7,720,237 B2 5/2010 Bharitkar et al.
7,742,740 B2 6/2010 Goldberg et al.
7,769,183 B2 8/2010 Bharitkar et al.
7,796,068 B2 9/2010 Raz et al.
7,835,689 B2 11/2010 Goldberg et al.
7,853,341 B2 12/2010 McCarty et al.
7,876,903 B2 1/2011 Sauk
7,925,203 B2 4/2011 Lane et al.
7,949,140 B2 5/2011 Kino
7,949,707 B2 5/2011 McDowall et al.
7,961,893 B2 6/2011 Kino
7,970,922 B2 6/2011 Svendsen
7,987,294 B2 7/2011 Bryce et al.
8,005,228 B2 8/2011 Bharitkar et al.
8,014,423 B2 9/2011 Thaler et al.
8,045,721 B2 10/2011 Burgan et al.
8,045,952 B2 10/2011 Qureshey et al.
8,050,652 B2 11/2011 Qureshey et al.
8,063,698 B2 11/2011 Howard
8,074,253 B1 12/2011 Nathan
8,103,009 B2 1/2012 McCarty et al.
8,116,476 B2 2/2012 Inohara
8,126,172 B2 2/2012 Horbach et al.
8,131,390 B2 3/2012 Braithwaite et al.
8,139,774 B2 3/2012 Berardi et al.
8,144,883 B2 3/2012 Pdersen et al.
8,160,276 B2 4/2012 Liao et al.
8,160,281 B2 4/2012 Kim et al.
8,170,260 B2 5/2012 Reining et al.
8,175,292 B2 5/2012 Aylward et al.
8,175,297 B1 5/2012 Ho et al.
8,194,874 B2 6/2012 Starobin et al.
8,229,125 B2 7/2012 Short
8,233,632 B1 7/2012 Macdonald et al.
8,234,395 B2 7/2012 Millington et al.
8,238,547 B2 8/2012 Ohki et al.
8,238,578 B2 8/2012 Aylward
8,243,961 B1 8/2012 Morrill
8,264,408 B2 9/2012 Kainulainen et al.
8,265,310 B2 9/2012 Berardi et al.
8,270,620 B2 * 9/2012 Christensen ............ H04S 7/301
381/300
8,279,709 B2 10/2012 Choisel et al.
8,281,001 B2 10/2012 Busam et al.
8,290,185 B2 10/2012 Kim
8,291,349 B1 10/2012 Park et al.
8,300,845 B2 10/2012 Zurek et al.
8,306,235 B2 11/2012 Mahowald
8,325,931 B2 12/2012 Howard et al.
8,325,935 B2 12/2012 Rutschman
8,325,944 B1 12/2012 Duwenhorst et al.
8,331,585 B2 12/2012 Hagen et al.

(56) References Cited

U.S. PATENT DOCUMENTS 8,332,414 B2 12/2012 Nguyen et al.
8,379,876 B2 2/2013 Zhang
8,391,501 B2 3/2013 Khawand et al.
8,392,505 B2 3/2013 Haughay et al.
8,401,202 B2 3/2013 Brooking
8,433,076 B2 4/2013 Zurek et al.
8,452,020 B2 5/2013 Gregg et al.
8,463,184 B2 6/2013 Dua
8,483,853 B1 7/2013 Lambourne
8,488,799 B2 7/2013 Goldstein et al.
8,503,669 B2 8/2013 Mao
8,527,876 B2 9/2013 Wood et al.
8,577,045 B2 11/2013 Gibbs
8,577,048 B2 11/2013 Chaikin et al.
8,600,075 B2 12/2013 Lim
8,620,006 B2 12/2013 Berardi et al.
8,731,206 B1 5/2014 Park
8,755,538 B2 6/2014 Kwon
8,798,280 B2 8/2014 Goldberg et al.
8,819,554 B2 8/2014 Basso et al.
8,831,244 B2 9/2014 Apfel
8,855,319 B2 10/2014 Liu et al.
8,862,273 B2 10/2014 Karr
8,879,761 B2 11/2014 Johnson et al.
8,903,526 B2 12/2014 Beckhardt et al.
8,914,559 B2 12/2014 Kalayjian et al.
8,930,005 B2 * 1/2015 Reimann ................ H04R 27/00
700/94
8,934,647 B2 1/2015 Joyce et al.
8,934,655 B2 1/2015 Breen et al.
8,942,252 B2 1/2015 Balassanian et al.
8,965,033 B2 2/2015 Wiggins
8,965,546 B2 2/2015 Visser et al.
8,977,974 B2 3/2015 Kraut
8,984,442 B2 3/2015 Pirnack et al.
8,989,406 B2 3/2015 Wong et al.
8,995,687 B2 3/2015 Marino, Jr. et al.
8,996,370 B2 3/2015 Ansell
9,020,153 B2 4/2015 Britt, Jr.
9,021,153 B2 4/2015 Lu
9,065,929 B2 6/2015 Chen et al.
9,084,058 B2 7/2015 Reilly et al.
9,100,766 B2 8/2015 Soulodre et al.
9,106,192 B2 8/2015 Sheen et al.
9,179,233 B2 11/2015 Kang
9,215,545 B2 12/2015 Dublin et al.
9,219,460 B2 12/2015 Bush
9,231,545 B2 1/2016 Agustin et al.
9,286,384 B2 3/2016 Kuper et al.
9,288,597 B2 * 3/2016 Carlsson .............. H04R 29/001
9,300,266 B2 3/2016 Grokop
9,319,816 B1 4/2016 Narayanan
9,451,377 B2 9/2016 Massey et al.
9,462,399 B2 * 10/2016 Bharitkar ............... H04H 60/33
9,467,779 B2 10/2016 Iyengar et al.
9,472,201 B1 10/2016 Sleator
9,489,948 B1 11/2016 Chu et al.
9,524,098 B2 12/2016 Griffiths et al.
9,538,305 B2 1/2017 Lehnert et al.
9,538,308 B2 1/2017 Isaac et al.
9,560,449 B2 1/2017 Carlsson et al.
9,560,460 B2 1/2017 Chaikin et al.
9,609,383 B1 3/2017 Hirst
9,615,171 B1 4/2017 O'Neill et al.
9,674,625 B2 6/2017 Armstrong-Muntner et al.
9,689,960 B1 6/2017 Barton et al.
9,690,271 B2 * 6/2017 Sheen ..................... G06F 3/165
9,706,323 B2 * 7/2017 Sheen .................. H04R 29/007
9,723,420 B2 8/2017 Family et al.
9,743,207 B1 8/2017 Hartung
9,743,208 B2 * 8/2017 Oishi ....................... H04R 3/12
9,763,018 B1 * 9/2017 McPherson .......... H04R 29/007
9,788,113 B2 * 10/2017 Wilberding ............ H03G 5/005
9,860,662 B2 1/2018 Jarvis et al.
9,864,574 B2 1/2018 Hartung et al.
10,045,142 B2 * 8/2018 McPherson ............ H04R 27/00
10,206,052 B2 2/2019 Perianu
10,299,054 B2 * 5/2019 McPherson .......... H04R 29/007
2001/0038702 A1 11/2001 Lavoie et al.
2001/0042107 A1 11/2001 Palm
2001/0043592 A1 11/2001 Jimenez et al.
2002/0022453 A1 2/2002 Balog et al.
2002/0026442 A1 2/2002 Lipscomb et al.
2002/0078161 A1 6/2002 Cheng
2002/0089529 A1 7/2002 Robbin
2002/0124097 A1 9/2002 Isely et al.
2002/0126852 A1 * 9/2002 Kashani ............... G10K 11/178
381/71.4
2002/0136414 A1 9/2002 Jordan et al.
2002/0146136 A1 10/2002 Carter et al.
2003/0002689 A1 1/2003 Folio
2003/0031334 A1 2/2003 Layton et al.
2003/0157951 A1 8/2003 Hasty
2003/0161479 A1 8/2003 Yang et al.
2003/0161492 A1 8/2003 Miller et al.
2003/0179891 A1 9/2003 Rabinowitz et al.
2003/0235311 A1 12/2003 Grancea et al.
2004/0024478 A1 2/2004 Hans et al.
2004/0131338 A1 7/2004 Asada et al.
2004/0237750 A1 12/2004 Smith et al.
2005/0031143 A1 2/2005 Devantier et al.
2005/0063554 A1 3/2005 Devantier et al.
2005/0147261 A1 7/2005 Yeh
2005/0157885 A1 7/2005 Olney et al.
2006/0008256 A1 1/2006 Khedouri et al.
2006/0026521 A1 2/2006 Hotelling et al.
2006/0032357 A1 2/2006 Roovers
2006/0195480 A1 8/2006 Spiegelman et al.
2006/0225097 A1 10/2006 Lawrence-Apfelbaum
2007/0003067 A1 1/2007 Gierl et al.
2007/0025559 A1 2/2007 Mihelich et al.
2007/0032895 A1 2/2007 Nackvi et al.
2007/0038999 A1 2/2007 Millington
2007/0086597 A1 4/2007 Kino
2007/0116254 A1 5/2007 Looney et al.
2007/0121955 A1 5/2007 Johnston et al.
2007/0142944 A1 6/2007 Goldberg et al.
2008/0002839 A1 1/2008 Eng
2008/0014989 A1 1/2008 Sandegard et al.
2008/0065247 A1 3/2008 Igoe et al.
2008/0069378 A1 3/2008 Rabinowitz et al.
2008/0077261 A1 3/2008 Baudino et al.
2008/0098027 A1 4/2008 Aarts
2008/0136623 A1 6/2008 Calvarese
2008/0144864 A1 6/2008 Huon et al.
2008/0175411 A1 7/2008 Greve
2008/0214160 A1 9/2008 Jonsson
2008/0232603 A1 * 9/2008 Soulodre .................. G01H 7/00
381/63
2008/0266385 A1 10/2008 Smith et al.
2008/0281523 A1 * 11/2008 Dahl ................... H04L 25/0212
702/5
2009/0003613 A1 * 1/2009 Christensen ............ H04S 7/301
381/58
2009/0024662 A1 1/2009 Park et al.
2009/0047993 A1 2/2009 Vasa
2009/0063274 A1 3/2009 Dublin, III et al.
2009/0110218 A1 4/2009 Swain
2009/0138507 A1 5/2009 Burckart et al.
2009/0147134 A1 6/2009 Iwamatsu
2009/0180632 A1 * 7/2009 Goldberg ................ H04S 7/301
381/59
2009/0196428 A1 8/2009 Kim
2009/0202082 A1 * 8/2009 Bharitkar .................. H04S 7/30
381/17
2009/0252481 A1 10/2009 Ekstrand
2009/0304205 A1 12/2009 Hardacker et al.
2009/0316923 A1 12/2009 Tashev et al.
2010/0095332 A1 4/2010 Gran et al.
2010/0128902 A1 5/2010 Liu et al.
2010/0135501 A1 6/2010 Corbett et al.
2010/0142735 A1 6/2010 Yoon et al.
2010/0146445 A1 6/2010 Kraut
2010/0162117 A1 6/2010 Basso et al.

(56) References Cited

U.S. PATENT DOCUMENTS

2010/0189203 A1 7/2010 Wilhelmsson et al.
2010/0195846 A1 8/2010 Yokoyama
2010/0272270 A1 10/2010 Chaikin et al.
2010/0296659 A1 11/2010 Tanaka
2010/0303248 A1 12/2010 Tawada
2010/0303250 A1* 12/2010 Goldberg ............. H04R 29/001 381/59
2010/0323793 A1 12/2010 Andall
2011/0007904 A1 1/2011 Tomoda et al.
2011/0007905 A1 1/2011 Sato et al.
2011/0087842 A1 4/2011 Lu et al.
2011/0091055 A1 4/2011 Leblanc
2011/0135103 A1 6/2011 Sun et al.
2011/0170710 A1 7/2011 Son
2011/0234480 A1 9/2011 Fino et al.
2011/0235808 A1 9/2011 Kon
2011/0268281 A1 11/2011 Florencio et al.
2012/0032928 A1* 2/2012 Alberth ................. G06F 3/0418 345/177
2012/0051558 A1 3/2012 Kim et al.
2012/0057724 A1 3/2012 Rabinowitz et al.
2012/0093320 A1 4/2012 Flaks et al.
2012/0127831 A1 5/2012 Gicklhorn et al.
2012/0140936 A1 6/2012 Bonnick et al.
2012/0148075 A1* 6/2012 Goh ........................ H04S 7/301 381/303
2012/0183156 A1 7/2012 Schlessinger et al.
2012/0213391 A1 8/2012 Usami et al.
2012/0215530 A1* 8/2012 Harsch ................... H04R 27/00 704/225
2012/0237037 A1 9/2012 Ninan et al.
2012/0243697 A1 9/2012 Frye et al.
2012/0263325 A1 10/2012 Freeman et al.
2012/0268145 A1 10/2012 Chandra et al.
2012/0269356 A1 10/2012 Sheerin et al.
2012/0275613 A1* 11/2012 Soulodre ................. H04S 7/305 381/63
2012/0283593 A1 11/2012 Searchfield et al.
2012/0288124 A1* 11/2012 Fejzo ....................... H04R 5/02 381/303
2013/0010970 A1 1/2013 Hegarty et al.
2013/0028443 A1 1/2013 Pance et al.
2013/0051572 A1* 2/2013 Goh ........................ H04S 7/302 381/59
2013/0066453 A1 3/2013 Seefeldt
2013/0108055 A1 5/2013 Hanna et al.
2013/0129102 A1 5/2013 Li et al.
2013/0129122 A1 5/2013 Johnson et al.
2013/0166227 A1 6/2013 Hermann et al.
2013/0202131 A1 8/2013 Kemmochi et al.
2013/0211843 A1 8/2013 Clarkson
2013/0216071 A1 8/2013 Maher et al.
2013/0223642 A1 8/2013 Warren et al.
2013/0230175 A1 9/2013 Bech et al.
2013/0259254 A1 10/2013 Xiang et al.
2013/0279706 A1 10/2013 Marti et al.
2013/0305152 A1 11/2013 Griffiths et al.
2013/0315405 A1 11/2013 Kanishima et al.
2013/0329896 A1 12/2013 Krishnaswamy et al.
2013/0331970 A1 12/2013 Beckhardt et al.
2014/0003622 A1 1/2014 Ikizyan et al.
2014/0003623 A1 1/2014 Lang
2014/0003625 A1 1/2014 Sheen et al.
2014/0003626 A1 1/2014 Holman et al.
2014/0003635 A1 1/2014 Mohammad et al.
2014/0006587 A1 1/2014 Kusano et al.
2014/0016784 A1 1/2014 Sen et al.
2014/0016786 A1 1/2014 Sen
2014/0016802 A1 1/2014 Sen
2014/0023196 A1 1/2014 Xiang et al.
2014/0029201 A1 1/2014 Yang et al.
2014/0032709 A1 1/2014 Saussy et al.
2014/0037097 A1 2/2014 Labosco
2014/0037107 A1 2/2014 Marino, Jr. et al.
2014/0052770 A1 2/2014 Gran et al.
2014/0064501 A1 3/2014 Olsen et al.
2014/0079242 A1 3/2014 Nguyen et al.
2014/0084014 A1 3/2014 Sim et al.
2014/0086423 A1 3/2014 Domingo Yaguez et al.
2014/0112481 A1 4/2014 Li et al.
2014/0119551 A1* 5/2014 Bharitkar ............... H04H 60/33 381/59
2014/0126730 A1 5/2014 Crawley et al.
2014/0161265 A1 6/2014 Chaikin et al.
2014/0169569 A1 6/2014 Toivanen et al.
2014/0180684 A1 6/2014 Strub
2014/0192986 A1 7/2014 Lee et al.
2014/0219456 A1 8/2014 Morrell et al.
2014/0219483 A1 8/2014 Hong
2014/0226823 A1 8/2014 Sen et al.
2014/0242913 A1 8/2014 Pang
2014/0267148 A1 9/2014 Luna et al.
2014/0270202 A1 9/2014 Ivanov et al.
2014/0270282 A1 9/2014 Tammi et al.
2014/0273859 A1 9/2014 Luna et al.
2014/0279889 A1 9/2014 Luna et al.
2014/0285313 A1 9/2014 Luna et al.
2014/0286496 A1 9/2014 Luna et al.
2014/0294200 A1 10/2014 Baumgarte et al.
2014/0294201 A1 10/2014 Johnson et al.
2014/0310269 A1 10/2014 Zhang et al.
2014/0321670 A1 10/2014 Nystrom et al.
2014/0323036 A1 10/2014 Daley et al.
2014/0334644 A1* 11/2014 Selig ....................... G06F 3/165 381/108
2014/0341399 A1 11/2014 Dusse
2014/0344689 A1 11/2014 Scott et al.
2014/0355768 A1 12/2014 Sen et al.
2014/0355794 A1 12/2014 Morrell et al.
2015/0011195 A1 1/2015 Li
2015/0016642 A1 1/2015 Walsh et al.
2015/0023509 A1 1/2015 Devantier et al.
2015/0031287 A1 1/2015 Pang et al.
2015/0032844 A1 1/2015 Tarr et al.
2015/0036847 A1 2/2015 Donaldson
2015/0036848 A1 2/2015 Donaldson
2015/0043736 A1 2/2015 Olsen et al.
2015/0063610 A1 3/2015 Mossner
2015/0078586 A1 3/2015 Ang et al.
2015/0078596 A1* 3/2015 Sprogis .................. H04R 5/027 381/303
2015/0100991 A1 4/2015 Risberg et al.
2015/0146886 A1 5/2015 Baumgarte
2015/0149943 A1* 5/2015 Nguyen ............... G06K 9/0057 715/769
2015/0161360 A1 6/2015 Paruchuri et al.
2015/0195666 A1 7/2015 Massey et al.
2015/0201274 A1 7/2015 Ellner et al.
2015/0208184 A1 7/2015 Tan et al.
2015/0212788 A1 7/2015 Lang
2015/0220558 A1 8/2015 Snibbe et al.
2015/0223002 A1 8/2015 Mehta et al.
2015/0229699 A1 8/2015 Liu
2015/0260754 A1 9/2015 Perotti et al.
2015/0271616 A1 9/2015 Kechichian et al.
2015/0281866 A1 10/2015 Williams et al.
2015/0289064 A1 10/2015 Jensen et al.
2015/0358756 A1 12/2015 Harma et al.
2015/0382128 A1 12/2015 Ridihalgh et al.
2016/0007116 A1 1/2016 Holman
2016/0011846 A1 1/2016 Sheen
2016/0011850 A1 1/2016 Sheen et al.
2016/0014509 A1 1/2016 Hansson et al.
2016/0014510 A1 1/2016 Sheen et al.
2016/0014511 A1 1/2016 Sheen et al.
2016/0014534 A1* 1/2016 Sheen .................. H04R 29/007 381/59
2016/0014536 A1 1/2016 Sheen
2016/0021458 A1 1/2016 Johnson et al.
2016/0021473 A1 1/2016 Riggi et al.
2016/0021481 A1 1/2016 Johnson et al.
2016/0027467 A1 1/2016 Proud
2016/0029142 A1 1/2016 Isaac et al.

(56) References Cited

U.S. PATENT DOCUMENTS

| | | | | |
|---|---|---|---|---|
| 2016/0035337 | A1 | 2/2016 | Aggarwal et al. | |
| 2016/0036881 | A1 | 2/2016 | Tembey et al. | |
| 2016/0037277 | A1 | 2/2016 | Matsumoto et al. | |
| 2016/0061597 | A1 | 3/2016 | De Bruijn et al. | |
| 2016/0070526 | A1 | 3/2016 | Sheen | |
| 2016/0073210 | A1 | 3/2016 | Sheen et al. | |
| 2016/0119730 | A1 | 4/2016 | Virtanen | |
| 2016/0140969 | A1* | 5/2016 | Srinivasan | H04N 21/4394 704/500 |
| 2016/0165297 | A1 | 6/2016 | Jamal-Syed et al. | |
| 2016/0192098 | A1* | 6/2016 | Oishi | H04R 29/001 381/56 |
| 2016/0192099 | A1* | 6/2016 | Oishi | G06F 3/165 381/56 |
| 2016/0212535 | A1 | 7/2016 | Le Nerriec et al. | |
| 2016/0239255 | A1 | 8/2016 | Chavez et al. | |
| 2016/0260140 | A1 | 9/2016 | Shirley et al. | |
| 2016/0309276 | A1 | 10/2016 | Ridihalgh et al. | |
| 2016/0313971 | A1 | 10/2016 | Bierbower et al. | |
| 2016/0316305 | A1 | 10/2016 | Sheen et al. | |
| 2016/0330562 | A1 | 11/2016 | Crockett | |
| 2016/0366517 | A1 | 12/2016 | Chandran et al. | |
| 2017/0069338 | A1 | 3/2017 | Elliot et al. | |
| 2017/0083279 | A1 | 3/2017 | Sheen et al. | |
| 2017/0086003 | A1 | 3/2017 | Rabinowitz et al. | |
| 2017/0105084 | A1 | 4/2017 | Holman | |
| 2017/0142532 | A1 | 5/2017 | Pan | |
| 2017/0207762 | A1 | 7/2017 | Porter et al. | |
| 2017/0223447 | A1 | 8/2017 | Johnson et al. | |
| 2017/0230772 | A1 | 8/2017 | Johnson et al. | |
| 2017/0257722 | A1 | 9/2017 | Kerdranvat et al. | |
| 2017/0280265 | A1 | 9/2017 | Po | |
| 2017/0303039 | A1 | 10/2017 | Iyer et al. | |
| 2017/0311108 | A1 | 10/2017 | Patel et al. | |
| 2017/0374482 | A1* | 12/2017 | McPherson | H04R 29/007 |
| 2019/0037328 | A1* | 1/2019 | McPherson | H04R 27/00 |
| 2019/0320278 | A1* | 10/2019 | McPherson | H04R 29/007 |

FOREIGN PATENT DOCUMENTS

| | | | |
|---|---|---|---|
| CN | 101491116 | A | 7/2009 |
| CN | 102318325 | A | 1/2012 |
| CN | 102893633 | A | 1/2013 |
| CN | 103988523 | A | 8/2014 |
| EP | 0505949 | A1 | 9/1992 |
| EP | 0772374 | A2 | 5/1997 |
| EP | 1133896 | B1 | 8/2002 |
| EP | 1349427 | A2 | 10/2003 |
| EP | 1389853 | A1 | 2/2004 |
| EP | 2043381 | A2 | 4/2009 |
| EP | 1349427 | B1 | 12/2009 |
| EP | 2161950 | A2 | 3/2010 |
| EP | 2194471 | A1 | 6/2010 |
| EP | 2197220 | A2 | 6/2010 |
| EP | 2429155 | A1 | 3/2012 |
| EP | 1825713 | B1 | 10/2012 |
| EP | 2613573 | A1 | 7/2013 |
| EP | 2591617 | B1 | 6/2014 |
| EP | 2835989 | A2 | 2/2015 |
| EP | 2860992 | A1 | 4/2015 |
| EP | 3128767 | A2 | 2/2017 |
| EP | 2974382 | B1 | 4/2017 |
| JP | H02280199 | A | 11/1990 |
| JP | H05199593 | A | 8/1993 |
| JP | H05211700 | A | 8/1993 |
| JP | H06327089 | A | 11/1994 |
| JP | H0723490 | A | 1/1995 |
| JP | H1069280 | A | 3/1998 |
| JP | 2002502193 | A | 1/2002 |
| JP | 2003143252 | A | 5/2003 |
| JP | 2003304590 | A | 10/2003 |
| JP | 2005086686 | A | 3/2005 |
| JP | 2005538633 | A | 12/2005 |
| JP | 2006017893 | A | 1/2006 |
| JP | 2006180039 | A | 7/2006 |
| JP | 2007068125 | A | 3/2007 |
| JP | 2007271802 | A | 10/2007 |
| JP | 2008228133 | A | 9/2008 |
| JP | 2009188474 | A | 8/2009 |
| JP | 2010081124 | A | 4/2010 |
| JP | 2011123376 | A | 6/2011 |
| JP | 2011164166 | A | 8/2011 |
| JP | 2011217068 | A | 10/2011 |
| JP | 2013253884 | A | 12/2013 |
| KR | 1020060116383 | | 11/2006 |
| KR | 1020080011831 | | 2/2008 |
| WO | 200153994 | | 7/2001 |
| WO | 0182650 | A2 | 11/2001 |
| WO | 200182650 | | 11/2001 |
| WO | 2003093950 | A2 | 11/2003 |
| WO | 2004066673 | A1 | 8/2004 |
| WO | 2007016465 | A2 | 2/2007 |
| WO | 2011139502 | A1 | 11/2011 |
| WO | 2013016500 | A1 | 1/2013 |
| WO | 2014032709 | | 3/2014 |
| WO | 2014032709 | A1 | 3/2014 |
| WO | 2014036121 | A1 | 3/2014 |
| WO | 2015024881 | A1 | 2/2015 |
| WO | 2015108794 | A1 | 7/2015 |
| WO | 2015178950 | A1 | 11/2015 |
| WO | 2016040324 | A1 | 3/2016 |
| WO | 2017049169 | A1 | 3/2017 |

OTHER PUBLICATIONS

Notice of Allowance dated Nov. 9, 2016, issued in connection with U.S. Appl. No. 14/805,340, filed Jul. 21, 2015, 13 pages.

Notice of Allowance dated Feb. 1, 2018, issued in connection with U.S. Appl. No. 15/480,265, filed Apr. 5, 2017, 8 pages.

Notice of Allowance dated Apr. 10, 2015, issued in connection with U.S. Appl. No. 13/536,493, filed Jun. 28, 2012, 8 pages.

Notice of Allowance dated Aug. 10, 2018, issued in connection with U.S. Appl. No. 15/785,088, filed Oct. 16, 2017, 6 pages.

Notice of Allowance dated Jul. 10, 2018, issued in connection with U.S. Appl. No. 15/673,170, filed Aug. 9, 2017, 2 pages.

Notice of Allowance dated Dec. 11, 2018, issued in connection with U.S. Appl. No. 15/909,327, filed Mar. 1, 2018, 10 pages.

Notice of Allowance dated Feb. 11, 2019, issued in connection with U.S. Appl. No. 15/588,186, filed May 5, 2017, 5 pages.

Notice of Allowance dated Jul. 11, 2017, issued in connection with U.S. Appl. No. 14/678,248, filed Apr. 3, 2015, 11 pages.

Notice of Allowance dated Mar. 11, 2015, issued in connection with U.S. Appl. No. 13/340,126, filed Dec. 29, 2011, 7 pages.

Notice of Allowance dated Apr. 12, 2016, issued in connection with U.S. Appl. No. 14/681,465, filed Apr. 8, 2015, 13 pages.

Notice of Allowance dated Dec. 12, 2016, issued in connection with U.S. Appl. No. 14/805,140, filed Jul. 21, 2015, 24 pages.

Notice of Allowance dated Dec. 12, 2017, issued in connection with U.S. Appl. No. 14/481,505, filed Sep. 9, 2014, 9 pages.

Notice of Allowance dated Sep. 12, 2016, issued in connection with U.S. Appl. No. 15/066,072, filed Mar. 10, 2016, 7 pages.

Notice of Allowance dated Sep. 12, 2017, issued in connection with U.S. Appl. No. 15/207,682, filed Jul. 12, 2016, 8 pages.

Notice of Allowance dated Feb. 13, 2017, issued in connection with U.S. Appl. No. 14/864,506, filed Sep. 24, 2015, 8 pages.

Notice of Allowance dated Nov. 13, 2017, issued in connection with U.S. Appl. No. 14/726,921, filed Jun. 1, 2015, 8 pages.

Notice of Allowance dated Mar. 14, 2019, issued in connection with U.S. Appl. No. 15/343,996, filed Nov. 4, 2016, 8 pages.

Notice of Allowance dated Jan. 15, 2019, issued in connection with U.S. Appl. No. 16/115,524, filed Aug. 28, 2018, 8 pages.

Notice of Allowance dated Jun. 15, 2017, issued in connection with U.S. Appl. No. 15/096,827, filed Apr. 12, 2016, 5 pages.

Notice of Allowance dated Mar. 15, 2017, issued in connection with U.S. Appl. No. 14/826,856, filed Aug. 14, 2015, 7 pages.

Notice of Allowance dated May 15, 2019, issued in connection with U.S. Patent Application No. 16/113,032, filed Aug. 27, 2018, 9 pages.

(56) References Cited

OTHER PUBLICATIONS

Notice of Allowance dated Oct. 15, 2018, issued in connection with U.S. Appl. No. 15/716,313, filed Sep. 26, 2017, 10 pages.
Notice of Allowance dated Jun. 16, 2017, issued in connection with U.S. Appl. No. 14/884,001, filed Oct. 15, 2015, 8 pages.
Notice of Allowance dated May 16, 2019, issued in connection with U.S. Appl. No. 16/181,213, filed Nov. 5, 2018, 10 pages.
Notice of Allowance dated Oct. 16, 2017, issued in connection with U.S. Appl. No. 15/478,770, filed Apr. 4, 2017, 10 pages.
Notice of Allowance dated Sep. 16, 2016, issued in connection with U.S. Appl. No. 15/066,049, filed Mar. 10, 2016, 7 pages.
Notice of Allowance dated Dec. 17, 2018, issued in connection with U.S. Appl. No. 16/055,884, filed Aug. 6, 2018, 5 pages.
Notice of Allowance dated May 17, 2017, issued in connection with U.S. Appl. No. 15/339,260, filed Oct. 31, 2016, 7 pages.
Notice of Allowance dated Mar. 18, 2019, issued in connection with U.S. Appl. No. 16/056,862, filed Aug. 7, 2018, 12 pages.
Notice of Allowance dated Aug. 19, 2016, issued in connection with U.S. Appl. No. 14/644,136, filed Mar. 10, 2015, 12 pages.
Notice of Allowance dated Jun. 19, 2017, issued in connection with U.S. Appl. No. 14/793,190, filed Jul. 7, 2015, 5 pages.
Notice of Allowance dated Sep. 19, 2017, issued in connection with U.S. Appl. No. 14/793,205, filed Jul. 7, 2015, 16 pages.
Notice of Allowance dated Sep. 19, 2018, issued in connection with U.S. Appl. No. 14/864,393, filed Sep. 24, 2015, 10 pages.
Notice of Allowance dated Apr. 20, 2017, issued in connection with U.S. Appl. No. 14/940,779, filed Nov. 13, 2015, 11 pages.
Notice of Allowance dated Nov. 20, 2017, issued in connection with U.S. Appl. No. 15/298,115, filed Oct. 19, 2016, 10 pages.
Notice of Allowance dated Sep. 20, 2017, issued in connection with U.S. Appl. No. 14/481,514, filed Sep. 9, 2014, 10 pages.
Notice of Allowance dated Dec. 21, 2016, issued in connection with U.S. Appl. No. 14/682,182, filed Apr. 9, 2015, 8 pages.
Notice of Allowance dated Feb. 21, 2018, issued in connection with U.S. Appl. No. 15/005,853, filed Jan. 25, 2016, 5 pages.
Notice of Allowance dated Jul. 21, 2017, issued in connection with U.S. Appl. No. 15/211,835, filed Jul. 15, 2016, 10 pages.
Notice of Allowance dated Jun. 21, 2019, issued in connection with U.S. Appl. No. 15/235,598, filed Aug. 12, 2016, 11 pages.
Notice of Allowance dated Jun. 22, 2017, issued in connection with U.S. Appl. No. 14/644,136, filed Mar. 10, 2015, 12 pages.
Notice of Allowance dated Aug. 23, 2018, issued in connection with U.S. Appl. No. 15/909,529, filed Mar. 1, 2018, 8 pages.
Notice of Allowance dated Jun. 23, 2016, issued in connection with U.S. Appl. No. 14/921,781, filed Oct. 23, 2015, 8 pages.
Notice of Allowance dated May 23, 2018, issued in connection with U.S. Appl. No. 15/698,283, filed Sep. 7, 2017, 8 pages.
Notice of Allowance dated Oct. 23, 2017, issued in connection with U.S. Appl. No. 14/481,522, filed Sep. 9, 2014, 16 pages.
Notice of Allowance dated Sep. 23, 2016, issued in connection with U.S. Appl. No. 15/070,160, filed Mar. 15, 2016, 7 pages.
Notice of Allowance dated Jul. 24, 2019, issued in connection with U.S. Appl. No. 15/229,693, filed Aug. 5, 2016, 13 pages.
Notice of Allowance dated May 24, 2017, issued in connection with U.S. Appl. No. 14/997,868, filed Jan. 18, 2016, 5 pages.
Notice of Allowance dated Nov. 24, 2017, issued in connection with U.S. Appl. No. 15/681,640, filed Aug. 21, 2017, 8 pages.
PRISMIQ, Inc., "PRISMIQ Media Player User Guide," 2003, 44 pages.
Ross, Alex, "Wizards of Sound: Retouching acoustics, from the restaurant to the concert hall," The New Yorker, Feb. 23, 2015. Web. Feb. 26, 2015, 9 pages.
Supplemental Notice of Allowability dated Oct. 27, 2016, issued in connection with U.S. Appl. No. 14/481,511, filed Sep. 9, 2014, 6 pages.
U.S. Appl. No. 60/490,768, filed Jul. 28, 2003, entitled "Method for synchronizing audio playback between multiple networked devices," 13 pages.
U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Wikipedia, Server(Computing) https://web.archive.org/web/20160703173710/https://en.wikipedia.org/wiki/Server_(computing), published Jul. 3, 2016, 7 pages.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.
Notice of Allowance dated Apr. 25, 2017, issued in connection with U.S. Appl. No. 14/696,014, filed Apr. 24, 2015, 7 pages.
Notice of Allowance dated Apr. 25, 2017, issued in connection with U.S. Appl. No. 15/207,682, filed Jul. 12, 2016, 7 pages.
Notice of Allowance dated Apr. 25, 2019, issued in connection with U.S. Appl. No. 15/806,126, filed Nov. 7, 2017, 8 pages.
Notice of Allowance dated Oct. 25, 2016, issued in connection with U.S. Appl. No. 14/826,873, filed Aug. 14, 2015, 5 pages.
Notice of Allowance dated Feb. 26, 2016, issued in connection with U.S. Appl. No. 14/921,762, filed Oct. 23, 2015, 7 pages.
Notice of Allowance dated Jul. 26, 2016, issued in connection with U.S. Appl. No. 14/481,511, filed Sep. 9, 2014, 12 pages.
Notice of Allowance dated Oct. 26, 2016, issued in connection with U.S. Appl. No. 14/811,587, filed Jul. 28, 2015, 11 pages.
Notice of Allowance dated Feb. 27, 2017, issued in connection with U.S. Appl. No. 14/805,340, filed Jul. 21, 2015, 9 pages.
Notice of Allowance dated Jul. 27, 2017, issued in connection with U.S. Appl. No. 15/005,853, filed Jan. 25, 2016, 5 pages.
Notice of Allowance dated Jun. 27, 2017, issued in connection with U.S. Appl. No. 15/344,069, filed Nov. 4, 2016, 8 pages.
Notice of Allowance dated Aug. 28, 2017, issued in connection with U.S. Appl. No. 15/089,004, filed Apr. 1, 2016, 5 pages.
Notice of Allowance dated Jul. 28, 2017, issued in connection with U.S. Appl. No. 14/678,263, filed Apr. 3, 2015, 10 pages.
Notice of Allowance dated Jul. 28, 2017, issued in connection with U.S. Appl. No. 15/211,822, filed Jul. 15, 2016, 9 pages.
Notice of Allowance dated Mar. 28, 2018, issued in connection with U.S. Appl. No. 15/673,170, filed Aug. 9, 2017, 5 pages.
Notice of Allowance dated Aug. 29, 2018, issued in connection with U.S. Appl. No. 15/357,520, filed Nov. 21, 2016, 11 pages.
Notice of Allowance dated Aug. 29, 2018, issued in connection with U.S. Appl. No. 15/718,556, filed Sep. 28, 2017, 8 pages.
Notice of Allowance dated Dec. 29, 2017, issued in connection with U.S. Appl. No. 14/793,205, filed Jul. 7, 2015, 5 pages.
Notice of Allowance dated Jul. 29, 2016, issued in connection with U.S. Appl. No. 14/481,522, filed Sep. 9, 2014, 11 pages.
Notice of Allowance dated Oct. 29, 2015, issued in connection with U.S. Appl. No. 14/216,306, filed Mar. 17, 2014, 9 pages.
Notice of Allowance dated May 3, 2019, issued in connection with U.S. Appl. No. 15/217,399, filed Jul. 22, 2016, 7 pages.
Notice of Allowance dated May 3, 2019, issued in connection with U.S. Appl. No. 16/181,583, filed Nov. 6, 2018, 7 pages.
Notice of Allowance dated Aug. 30, 2017, issued in connection with U.S. Appl. No. 15/088,994, filed Apr. 1, 2016, 10 pages.
Notice of Allowance dated Dec. 30, 2016, issued in connection with U.S. Appl. No. 14/696,014, filed Apr. 24, 2015, 13 pages.
Notice of Allowance dated Jan. 30, 2017, issued in connection with U.S. Appl. No. 15/339,260, filed Oct. 31, 2016, 8 pages.
Notice of Allowance dated Aug. 31, 2018, issued in connection with U.S. Appl. No. 15/872,979, filed Jan. 16, 2018, 7 pages.
Notice of Allowance dated Aug. 31, 2018, issued in connection with U.S. Appl. No. 16/055,884, filed Aug. 6, 2018, 8 pages.
Notice of Allowance dated Apr. 4, 2017, issued in connection with U.S. Appl. No. 14/682,182, filed Apr. 9, 2015, 8 pages.
Notice of Allowance dated Feb. 4, 2019, issued in connection with U.S. Appl. No. 15/166,241, filed Aug. 26, 2016, 8 pages.
Notice of Allowance dated Feb. 4, 2019, issued in connection with U.S. Appl. No. 16/181,583, filed Nov. 6, 2018, 9 pages.
Notice of Allowance dated Oct. 4, 2018, issued in connection with U.S. Appl. No. 15/166,241, filed May 26, 2016, 7 pages.

(56) References Cited

OTHER PUBLICATIONS

Notice of Allowance dated Apr. 5, 2018, issued in connection with U.S. Appl. No. 15/681,640, filed Aug. 21, 2017, 8 pages.
Notice of Allowance dated Jun. 5, 2019, issued in connection with U.S. Appl. No. 15/859,311, filed Dec. 29, 2017, 8 pages.
Notice of Allowance dated Jun. 5, 2019, issued in connection with U.S. Appl. No. 15/865,221, filed Jan. 8, 2018, 8 pages.
Notice of Allowance dated Mar. 5, 2019, issued in connection with U.S. Appl. No. 16/102,499, filed Aug. 13, 2018, 8 pages.
Notice of Allowance dated May 5, 2017, issued in connection with U.S. Appl. No. 14/826,873, filed Aug. 14, 2015, 5 pages.
Notice of Allowance dated Oct. 5, 2018, issued in connection with U.S. Appl. No. 16/115,524, filed Aug. 28, 2018, 10 pages.
Notice of Allowance dated Feb. 6, 2019, issued in connection with U.S. Appl. No. 15/996,878, filed Jun. 4, 2018, 8 pages.
Notice of Allowance dated Apr. 8, 2019, issued in connection with U.S. Appl. No. 16/011,402, filed Jun. 18, 2018, 8 pages.
Notice of Allowance dated Jul. 8, 2019, issued in connection with U.S. Appl. No. 15/856,791, filed Dec. 28, 2017, 5 pages.
Notice of Allowance dated May 8, 2018, issued in connection with U.S. Appl. No. 15/650,386, filed Jul. 14, 2017, 13 pages.
Notice of Allowance dated May 9, 2019, issued in connection with U.S. Appl. No. 15/996,878, filed Jun. 4, 2018, 7 pages.
Notice of Allowance dated Apr. 19, 2017, issued in connection with U.S. Appl. No. 14/481,511, filed Sep. 9, 2014, 10 pages.
Palm, Inc., "Handbook for the Palm VII Handheld," May 2000, 311 pages.
Papp Istvan et al. "Adaptive Microphone Array for Unknown Desired Speaker's Transfer Function", The Journal of the Acoustical Society of America, American Institute of Physics for the Acoustical Society of America, New York, NY vol. 122, No. 2, Jul. 19, 2007, pp. 44-49.
Pre-Brief Appeal Conference Decision mailed on Mar. 19, 2019, issued in connection with U.S. Appl. No. 15/806,126, filed Nov. 7, 2017, 2 pages.
Preinterview First Office Action dated Oct. 6, 2016, issued in connection with U.S. Appl. No. 14/726,921, filed Jun. 1, 2015, 6 pages.
Preinterview First Office Action dated Jul. 12, 2017, issued in connection with U.S. Appl. No. 14/793,205, filed Jul. 7, 2015, 5 pages.
Preinterview First Office Action dated May 17, 2016, issued in connection with U.S. Appl. No. 14/481,505, filed Sep. 9, 2014, 7 pages.
Preinterview First Office Action dated May 25, 2016, issued in connection with U.S. Appl. No. 14/481,514, filed Sep. 9, 2014, 7 pages.
Presentations at WinHEC 2000, May 2000, 138 pages.
Non-Final Office Action dated Sep. 12, 2016, issued in connection with U.S. Appl. No. 14/811,587, filed Jul. 28, 2015, 24 pages.
Non-Final Office Action dated Jul. 28, 2016, issued in connection with U.S. Appl. No. 14/940,779, filed Nov. 13, 2015, 16 pages.
Non-Final Office Action dated Dec. 14, 2016, issued in connection with U.S. Appl. No. 14/481,505, filed Sep. 9, 2014, 19 pages.
Non-Final Office Action dated Mar. 14, 2017, issued in connection with U.S. Appl. No. 15/096,827, filed Apr. 12, 2016, 12 pages.
Non-Final Office Action dated May 14, 2019, issued in connection with U.S. Appl. No. 15/955,545, filed Apr. 17, 2018, 15 pages.
Non-Final Office Action dated Oct. 14, 2015, issued in connection with U.S. Appl. No. 14/216,325, filed Mar. 17, 2014, 7 pages.
Non-Final Office Action dated May 15, 2018, issued in connection with U.S. Appl. No. 15/806,126, filed Nov. 7, 2017, 17 pages.
Non-Final Office Action dated Jun. 16, 2017, issued in connection with U.S. Appl. No. 15/005,496, filed Jan. 25, 2016, 15 pages.
Non-Final Office Action dated Nov. 16, 2018, issued in connection with U.S. Appl. No. 15/996,878, filed Jun. 4, 2018, 8 pages.
Non-Final Office Action dated Dec. 18, 2018, issued in connection with U.S. Appl. No. 16/011,402, filed Jun. 18, 2018, 10 pages.
Non-Final Office Action dated Feb. 18, 2016, issued in connection with U.S. Appl. No. 14/644,136, filed Mar. 10, 2015, 10 pages.
Non-Final Office Action dated Jun. 18, 2019, issued in connection with U.S. Appl. No. 15/005,496, filed Jan. 25, 2016, 15 pages.
Non-Final Office Action dated Sep. 19, 2017, issued in connection with U.S. Appl. No. 15/056,553, filed Feb. 29, 2016, 7 pages.
Non-Final Office Action dated Apr. 2, 2018, issued in connection with U.S. Appl. No. 15/872,979, filed Jan. 16, 2018, 6 pages.
Non-Final Office Action dated Aug. 2, 2017, issued in connection with U.S. Appl. No. 15/298,115, filed Oct. 19, 2016, 22 pages.
Non-Final Office Action dated Apr. 20, 2017, issued in connection with U.S. Appl. No. 15/005,853, filed Jan. 25, 2016, 8 pages.
Non-Final Office Action dated Jul. 20, 2016, issued in connection with U.S. Appl. No. 14/682,182, filed Apr. 9, 2015, 13 pages.
Non-Final Office Action dated Jun. 20, 2017, issued in connection with U.S. Appl. No. 15/207,682, filed Jul. 12, 2016, 17 pages.
Non-Final Office Action dated Dec. 21, 2018, issued in connection with U.S. Appl. No. 16/181,213, filed Nov. 5, 2018, 13 pages.
Non-Final Office Action dated Jun. 21, 2016, issued in connection with U.S. Appl. No. 14/678,248, filed Apr. 3, 2015, 10 pages.
Non-Final Office Action dated Jun. 21, 2019, issued in connection with U.S. Appl. No. 16/181,865, filed Nov. 6, 2018, 12 pages.
Non-Final Office Action dated Nov. 21, 2014, issued in connection with U.S. Appl. No. 13/536,493, filed Jun. 28, 2012, 20 pages.
Non-Final Office Action dated Jun. 22, 2018, issued in connection with U.S. Appl. No. 15/217,399, filed Jul. 22, 2016, 33 pages.
Non-Final Office Action dated Jan. 23, 2019, issued in connection with U.S. Appl. No. 16/113,032, filed Aug. 27, 2018, 8 pages.
Non-Final Office Action dated May 24, 2019, issued in connection with U.S. Appl. No. 16/401,981, filed May 2, 2019, 14 pages.
Non-Final Office Action dated Oct. 25, 2016, issued in connection with U.S. Appl. No. 14/864,506, filed Sep. 24, 2015, 9 pages.
Non-Final Office Action dated Sep. 26, 2018, issued in connection with U.S. Appl. No. 15/229,693, filed Aug. 5, 2016, 25 pages.
Non-Final Office Action dated Dec. 27, 2017, issued in connection with U.S. Appl. No. 15/357,520, filed Nov. 21, 2016, 28 pages.
Non-Final Office Action dated Feb. 27, 2018, issued in connection with U.S. Appl. No. 14/864,393, filed Sep. 24, 2015, 19 pages.
Non-Final Office Action dated Feb. 27, 2018, issued in connection with U.S. Appl. No. 15/718,556, filed Sep. 28, 2017, 19 pages.
Non-Final Office Action dated Jul. 27, 2016, issued in connection with U.S. Appl. No. 14/696,014, filed Apr. 24, 2015, 11 pages.
Non-Final Office Action dated Mar. 27, 2017, issued in connection with U.S. Appl. No. 15/211,835, filed Jul. 15, 2016, 30 pages.
Non-Final Office Action dated Mar. 27, 2018, issued in connection with U.S. Appl. No. 15/785,088, filed Oct. 16, 2017, 11 pages.
Non-Final Office Action dated Jul. 28, 2016, issued in connection with U.S. Appl. No. 14/884,001, filed Oct. 15, 2015, 8 pages.
Non-Final Office Action dated Nov. 28, 2017, issued in connection with U.S. Appl. No. 15/673,170, filed Aug. 9, 2017, 7 pages.
Non-Final Office Action dated Sep. 28, 2018, issued in connection with U.S. Appl. No. 15/588,186, filed May 5, 2017, 12 pages.
Non-Final Office Action dated Sep. 28, 2018, issued in connection with U.S. Appl. No. 15/595,519, filed May 15, 2017, 12 pages.
Non-Final Office Action dated Mar. 29, 2018, issued in connection with U.S. Appl. No. 15/716,313, filed Sep. 26, 2017, 16 pages.
Non-Final Office Action dated May 30, 2017, issued in connection with U.S. Appl. No. 15/478,770, filed Apr. 4, 2017, 9 pages.
Non-Final Office Action dated May 31, 2019, issued in connection with U.S. Appl. No. 16/185,906, filed Nov. 9, 2018, 7 pages.
Non-Final Office Action dated Nov. 6, 2018, issued in connection with U.S. Appl. No. 15/235,598, filed Aug. 12, 2016, 13 pages.
Non-Final Office Action dated Feb. 7, 2019, issued in connection with U.S. Appl. No. 15/859,311, filed Dec. 29, 2017, 9 pages.
Non-Final Office Action dated Feb. 7, 2019, issued in connection with U.S. Appl. No. 15/865,221, filed Jan. 8, 2018, 10 pages.
Non-Final Office Action dated Jan. 9, 2018, issued in connection with U.S. Appl. No. 15/698,283, filed Sep. 7, 2017, 18 pages.
Non-Final Office Action dated Jan. 9, 2018, issued in connection with U.S. Appl. No. 15/727,913, filed Oct. 9, 2017, 8 pages.
Notice of Allowance dated May 1, 2017, issued in connection with U.S. Appl. No. 14/805,140, filed Jul. 21, 2015, 13 pages.
Notice of Allowance dated Nov. 2, 2016, issued in connection with U.S. Appl. No. 14/884,001, filed Oct. 15, 2015, 8 pages.

(56) References Cited

OTHER PUBLICATIONS

Notice of Allowance dated Jun. 3, 2016, issued in connection with U.S. Appl. No. 14/921,799, filed Oct. 23, 2015, 8 pages.
Notice of Allowance dated Nov. 4, 2016, issued in connection with U.S. Appl. No. 14/481,514, filed Sep. 9, 2014, 10 pages.
Notice of Allowance dated Jun. 6, 2018, issued in connection with U.S. Appl. No. 15/727,913, filed Oct. 9, 2017, 5 pages.
International Searching Authority, International Search Report and Written Opinion dated Sep. 25, 2017, issued in connection with International Application No. PCT/US2017/042191, filed on Jul. 14, 2017, 16 pages.
International Searching Authority, International Search Report and Written Opinion dated Aug. 3, 2017, in connection with International Application No. PCT/US2017014596, 20 pages.
Japanese Patent Office, English Translation of Office Action dated May 8, 2018, issued in connection with Japanese Application No. 2017-513241, 4 pages.
Japanese Patent Office, Japanese Office Action dated Oct. 3, 2017, issued in connection with Japanese Application No. 2017-501082, 7 pages.
Japanese Patent Office, Non-Final Office Action with Translation dated Apr. 25, 2017, issued in connection with Japanese Patent Application No. 2016-568888, 7 pages.
Japanese Patent Office, Non-Final Office Action with Translation dated Oct. 3, 2017, issued in connection with Japanese Patent Application No. 2017-501082, 3 pages.
Japanese Patent Office, Office Action dated Jun. 12, 2018, issued in connection with Japanese Application No. 2018-502729, 4 pages.
Japanese Patent Office, Office Action dated May 14, 2019, issued in connection with Japanese Patent Application No. 2018-500529, 8 pages.
Japanese Patent Office, Office Action dated Aug. 21, 2018, issued in connection with Japanese Application No. 2018-514418, 7 pages.
Japanese Patent Office, Office Action dated Jul. 24, 2018, issued in connection with Japanese Application No. 2018-514419, 5 pages.
Japanese Patent Office, Office Action dated Jun. 4, 2019, issued in connection with Japanese Patent Application No. 2018-112810, 4 pages.
Japanese Patent Office, Office Action dated May 8, 2018, issued in connection with Japanese Application No. 2017-513241, 8 pages.
Japanese Patent Office, Office Action with English Summary dated Jul. 18, 2017, issued in connection with Japanese Patent Application No. 2017-513171, 4 pages.
Japanese Patent Office, Translation of Office Action dated May 14, 2019, issued in connection with Japanese Patent Application No. 2018-500529, 5 pages.
Jo et al., "Synchronized One-to-many Media Streaming with Adaptive Playout Control," Proceedings of SPIE, 2002, pp. 71-82, vol. 4861.
John Mark and Paul Hufnagel "What is 1451.4, what are its uses and how does it work?" IEEE Standards Association, The IEEE 1451.4 Standard for Smart Transducers, 14pages.
Jones, Stephen, "Dell Digital Audio Receiver: Digital upgrade for your analog stereo," Analog Stereo, Jun. 24, 2000 retrieved Jun. 18, 2014, 2 pages.
"auEQ for the iPhone," Mar. 25, 2015, retrieved from the internet: URL:https://web.archive.org/web20150325152629/http://www.hotto.de/mobileapps/iphoneaueq.html [retrieved on Jun. 24, 2016], 6 pages.
Louderback, Jim, "Affordable Audio Receiver Furnishes Homes With MP3," TechTV Vault. Jun. 28, 2000 retrieved Jul. 10, 2014, 2 pages.
Microsoft Corporation, "Using Microsoft Outlook 2003," Cambridge College, 2003.
Motorola, "Simplefi, Wireless Digital Audio Receiver, Installation and User Guide," Dec. 31, 2001, 111 pages.
Mulcahy, John, "Room EQ Wizard: Room Acoustics Software," REW, 2014, retrieved Oct. 10, 2014, 4 pages.
Non-Final Action dated Jan. 29, 2016, issued in connection with U.S. Appl. No. 14/481,511, filed Sep. 9, 2014, 10 pages.
Non-Final Office Action dated Mar. 1, 2017, issued in connection with U.S. Appl. No. 15/344,069, filed Nov. 4, 2016, 20 pages.
Non-Final Office Action dated Nov. 1, 2017, issued in connection with U.S. Appl. No. 15/235,598, filed Aug. 12, 2016, 15 pages.
Non-Final Office Action dated Jun. 2, 2014, issued in connection with U.S. Appl. No. 13/340,126, filed Dec. 29, 2011, 14 pages.
Non-Final Office Action dated Jun. 2, 2017, issued in connection with U.S. Appl. No. 15/229,693, filed Aug. 5, 2016, 18 pages.
Non-Final Office Action dated Nov. 2, 2017, issued in connection with U.S. Appl. No. 15/166,241, filed May 26, 2016, 12 pages.
Non-Final Office Action dated Oct. 2, 2017, issued in connection with U.S. Appl. No. 15/005,853, filed Jan. 25, 2016, 8 pages.
Non-Final Office Action dated Feb. 3, 2016, issued in connection with U.S. Appl. No. 14/481,522, filed Sep. 9, 2014, 12 pages.
Non-Final Office Action dated Jul. 3, 2018, issued in connection with U.S. Appl. No. 15/909,327, filed Mar. 1, 2018, 30 pages.
Non-Final Office Action dated Jan. 4, 2017, issued in connection with U.S. Appl. No. 15/207,682, filed Jul. 12, 2016, 6 pages.
Non-Final Office Action dated Nov. 4, 2016, issued in connection with U.S. Appl. No. 14/826,856, filed Aug. 14, 2015, 10 pages.
Non-Final Office Action dated Jul. 5, 2017, issued in connection with U.S. Appl. No. 14/481,522, filed Sep. 9, 2014, 8 pages.
Non-Final Office Action dated Jul. 6, 2016, issued in connection with U.S. Appl. No. 15/070,160, filed Mar. 15, 2016, 6 pages.
Non-Final Office Action dated Oct. 6, 2016, issued in connection with U.S. Appl. No. 14/678,263, filed Apr. 3, 2015, 30 pages.
Non-Final Office Action dated Jun. 6, 2018, issued in connection with U.S. Appl. No. 15/005,496, filed Jan. 25, 2016, 16 pages.
Non-Final Office Action dated Dec. 7, 2015, issued in connection with U.S. Appl. No. 14/921,762, filed Oct. 23, 2015, 5 pages.
Non-Final Office Action dated Jul. 7, 2016, issued in connection with U.S. Appl. No. 15/066,049, filed Mar. 10, 2016, 6 pages.
Non-Final Office Action dated Mar. 7, 2017, issued in connection with U.S. Appl. No. 14/481,514, filed Sep. 9, 2014, 24 pages.
Non-Final Office Action dated Sep. 7, 2016, issued in connection with U.S. Appl. No. 14/826,873, filed Aug. 14, 2015, 12 pages.
Non-Final Office Action dated Jul. 8, 2016, issued in connection with U.S. Appl. No. 15/066,072, filed Mar. 10, 2016, 6 pages.
Non-Final Office Action dated Dec. 9, 2016, issued in connection with U.S. Appl. No. 14/678,248, filed Apr. 3, 2015, 22 pages.
Non-Final Office Action dated Apr. 10, 2018, issued in connection with U.S. Appl. No. 15/909,529, filed Mar. 1, 2018, 8 pages.
Non-Final Office Action dated Mar. 10, 2017, issued in connection with U.S. Appl. No. 14/997,868, filed Jan. 18, 2016, 10 pages.
Non-Final Office Action dated Sep. 10, 2018, issued in connection with U.S. Appl. No. 15/056,553, filed Feb. 29, 2016, 8 pages.
Non-Final Office Action dated Apr. 11, 2017, issued in connection with U.S. Appl. No. 15/088,994, filed Apr. 1, 2016, 13 pages.
Non-Final Office Action dated Apr. 11, 2017, issued in connection with U.S. Appl. No. 15/089,004, filed Apr. 1, 2016, 9 pages.
Non-Final Office Action dated Oct. 11, 2017, issued in connection with U.S. Appl. No. 15/480,265, filed Apr. 5, 2017, 8 pages.
Non-Final Office Action dated Oct. 11, 2018, issued in connection with U.S. Appl. No. 15/856,791, filed Dec. 28, 2017, 13 pages.
European Patent Office, Office Action dated Jun. 13, 2017, issued in connection with European patent application No. 17000484.0, 10 pages.
European Patent Office, Office Action dated Dec. 15, 2016, issued in connection with European Application No. 15766998.7, 7 pages.
European Patent Office, Summons to Attend Oral Proceedings dated Nov. 15, 2018, issued in connection with European Application No. 16748186.0, 57 pages.
Ex Parte Quayle Office Action dated Apr. 15, 2019, issued in connection with U.S. Appl. No. 15/235,598, filed Aug. 12, 2016, 7 pages.
Final Office Action dated Apr. 3, 2017, issued in connection with U.S. Appl. No. 14/678,248, filed Apr. 3, 2015, 22 pages.
Final Office Action dated Jul. 13, 2017, issued in connection with U.S. Appl. No. 14/726,921, filed Jun. 1, 2015, 10 pages.
Final Office Action dated Jun. 13, 2017, issued in connection with U.S. Appl. No. 14/481,505, filed Sep. 9, 2014, 22 pages.
Final Office Action dated Feb. 14, 2019, issued in connection with U.S. Appl. No. 15/005,496, filed Jan. 25, 2016, 16 pages.

(56) References Cited

OTHER PUBLICATIONS

Final Office Action dated Feb. 14, 2019, issued in connection with U.S. Appl. No. 15/217,399, filed Jul. 22, 2016, 37 pages.
Final Office Action dated Oct. 14, 2016, issued in connection with U.S. Appl. No. 14/682,182, filed Apr. 9, 2015, 16 pages.
Final Office Action dated Oct. 17, 2016, issued in connection with U.S. Appl. No. 14/678,248, filed Apr. 3, 2015, 22 pages.
Final Office Action dated Apr. 18, 2017, issued in connection with U.S. Appl. No. 14/678,263, filed Apr. 3, 2015, 16 pages.
Final Office Action dated Apr. 18, 2018, issued in connection with U.S. Appl. No. 15/056,553, filed Feb. 29, 2016, 8 pages.
Final Office Action dated Dec. 18, 2014, issued in connection with U.S. Appl. No. 13/340,126, filed Dec. 29, 2011, 12 pages.
Final Office Action dated Jan. 19, 2017, issued in connection with U.S. Appl. No. 14/940,779, filed Nov. 13, 2015, 15 pages.
Final Office Action dated Apr. 2, 2018, issued in connection with U.S. Appl. No. 15/166,241, filed May 26, 2016, 14 pages.
Final Office Action dated Oct. 21, 2016, issued in connection with U.S. Appl. No. 14/696,014, filed Apr. 24, 2015, 13 pages.
Final Office Action dated Jan. 25, 2018, issued in connection with U.S. Appl. No. 15/005,496, filed Jan. 25, 2016, 17 pages.
Final Office Action dated Mar. 25, 2019, issued in connection with U.S. Appl. No. 15/856,791, filed Dec. 28, 2017, 11 pages.
Final Office Action dated Apr. 3, 2018, issued in connection with U.S. Appl. No. 15/235,598, filed Aug. 12, 2016, 12 pages.
Final Office Action dated Feb. 5, 2018, issued in connection with U.S. Appl. No. 15/229,693, filed Aug. 5, 2016, 21 pages.
Final Office Action dated Mar. 5, 2019, issued in connection with U.S. Appl. No. 15/056,553, filed Feb. 29, 2016, 9 pages.
Final Office Action dated Dec. 6, 2018, issued in connection with U.S. Appl. No. 15/806,126, filed Nov. 7, 2017, 18 pages.
Final Office Action dated Apr. 9, 2019, issued in connection with U.S. Appl. No. 15/229,693, filed Aug. 5, 2016, 33 pages.
First Action Interview Office Action dated Mar. 3, 2017, issued in connection with U.S. Appl. No. 14/726,921, filed Jun. 1, 2015, 9 pages.
First Action Interview Office Action dated Jul. 12, 2016, issued in connection with U.S. Appl. No. 14/481,514, filed Sep. 9, 2014, 10 pages.
First Action Interview Office Action dated Jun. 30, 2016, issued in connection with U.S. Appl. No. 14/481,505, filed Sep. 9, 2014, 9 pages.
First Action Interview Pilot Program Pre-Interview Communication dated Apr. 5, 2017, issued in connection with U.S. Appl. No. 14/793,190, filed Jul. 7, 2015, 4 pages.
First Action Interview Pilot Program Pre-Interview Communication dated Oct. 7, 2015, issued in connection with U.S. Appl. No. 14/216,306, filed Mar. 17, 2014, 5 pages.
First Action Interview Pilot Program Pre-Interview Communication dated Feb. 16, 2016, issued in connection with U.S. Appl. No. 14/681,465, filed Apr. 8, 2015, 5 pages.
Gonzalez et al., "Simultaneous Measurement of Multichannel Acoustic Systems," J. Audio Eng. Soc., 2004, pp. 26-42, vol. 52, No. 1/2.
International Bureau, International Preliminary Report on Patentability, dated Sep. 24, 2015, issued in connection with International Application No. PCT/US2014/030560, filed on Mar. 17, 2014, 7 pages.
International Bureau, International Preliminary Report on Patentability dated Sep. 29, 2016, issued in connection with International Application No. PCT/US2015/020993, filed on Mar. 17, 2015, 8 pages.
International Bureau, International Preliminary Report on Patentability dated Sep. 29, 2016, issued in connection with International Application No. PCT/US2015/021000, filed on Mar. 17, 2015, 9 pages.
International Bureau, International Preliminary Report on Patentability, dated Aug. 9, 2018, issued in connection with International Application No. PCT/US2017/014596, filed on Jan. 23, 2017, 11 pages.
International Searching Authority, International Preliminary Report on Patentability dated Mar. 23, 2017, issued in connection with International Patent Application No. PCT/US2015/048944, filed on Sep. 8, 2015, 8 pages.
International Searching Authority, International Preliminary Report on Patentability dated Oct. 24, 2017, issued in connection with International Application No. PCT/US2016/028994 filed on Apr. 22, 2016, 7 pages.
International Searching Authority, International Search Report and Written Opinion dated Jul. 4, 2016, issued in connection with International Application No. PCT/US2016/028994, filed on Apr. 22, 2016, 12 pages.
International Searching Authority, International Search Report and Written Opinion dated Jul. 5, 2016, issued in connection with International Application No. PCT/US2016/028997, filed on Apr. 22, 2016, 13 pages.
International Searching Authority, International Search Report and Written Opinion dated Jun. 5, 2015, issued in connection with International Application No. PCT/US2015/021000, filed on Mar. 17, 2015, 12 pages.
International Searching Authority, International Search Report and Written Opinion dated Oct. 12, 2016, issued in connection with International Application No. PCT/US2016/041179 filed on Jul. 6, 2016, 9 pages.
International Searching Authority, International Search Report and Written Opinion dated Jun. 16, 2015, issued in connection with International Application No. PCT/US2015/020993, filed on Mar. 17, 2015, 11 pages.
International Searching Authority, International Search Report and Written Opinion dated Nov. 18, 2015, issued in connection with International Application No. PCT/US2015/048954, filed on Sep. 8, 2015, 11 pages.
International Searching Authority, International Search Report and Written Opinion dated Oct. 18, 2016, issued in connection with International Application No. PCT/US2016/043116, filed Jul. 20, 2016, 14 pages.
International Searching Authority, International Search Report and Written Opinion dated Oct. 18, 2016, issued in connection with International Application No. PCT/US2016/043840, filed on Jul. 25, 2016, 14 pages.
International Searching Authority, International Search Report and Written Opinion dated Nov. 23, 2015, issued in connection with International Application No. PCT/US2015/048942, filed on Sep. 8, 2015, 14 pages.
International Searching Authority, International Search Report and Written Opinion dated Nov. 23, 2015, issued in connection with International Application No. PCT/US2015/048944, filed on Sep. 8, 2015, 12 pages.
International Searching Authority, International Search Report and Written Opinion dated Nov. 23, 2016, issued in connection with International Patent Application No. PCT/US2016/052266, filed on Sep. 16, 2016, 11 pages.
International Searching Authority, International Search Report and Written Opinion dated Jan. 24, 2017, issued in connection with International Application No. PCT/US2016/052264, filed on Sep. 16, 2016, 17 pages.
International Searching Authority, International Search Report and Written Opinion dated Oct. 25, 2016, issued in connection with International Application No. PCT/US2016/043109, filed on Jul. 20, 2016, 12 pages.
Advisory Action dated Jul. 1, 2019, issued in connection with U.S. Appl. No. 15/229,693, filed Aug. 5, 2016, 2 pages.
Advisory Action dated Jul. 10, 2018, issued in connection with U.S. Appl. No. 15/056,553, filed Feb. 29, 2016, 3 pages.
Advisory Action dated Jul. 12, 2018, issued in connection with U.S. Appl. No. 15/166,241, filed May 26, 2016, 3 pages.
Advisory Action dated Jul. 12, 2018, issued in connection with U.S. Appl. No. 15/235,598, filed Aug. 12, 2016, 3 pages.
Advisory Action dated Aug. 16, 2017, issued in connection with U.S. Appl. No. 14/481,505, filed Sep. 9, 2014, 3 pages.
Advisory Action dated Jun. 19, 2018, issued in connection with U.S. Appl. No. 15/229,693, filed Aug. 5, 2016, 3 pages.

(56) References Cited

OTHER PUBLICATIONS

Advisory Action dated Sep. 19, 2017, issued in connection with U.S. Appl. No. 14/726,921, filed Jun. 1, 2015, 3 pages.
Advisory Action dated Apr. 30, 2019, issued in connection with U.S. Appl. No. 15/005,496, filed Jan. 25, 2016, 3 pages.
Advisory Action dated Feb. 7, 2019, issued in connection with U.S. Appl. No. 15/806,126, filed Nov. 7, 2017, 3 pages.
An Overview of IEEE 1451.4 Transducer Electronic Data Sheets (TEDS) National Instruments, 19 pages.
AudioTron Quick Start Guide, Version 1.0, Mar. 2001, 24 pages.
AudioTron Reference Manual, Version 3.0, May 2002, 70 pages.
AudioTron Setup Guide, Version 3.0, May 2002, 38 pages.
Bluetooth. "Specification of the Bluetooth System: The ad hoc Scatternet for affordable and highly functional wireless connectivity," Core, Version 1.0A, Jul. 26, 1999, 1068 pages.
Bluetooth. "Specification of the Bluetooth System: Wireless connections made easy," Core, Version 1.0 B, Dec. 1, 1999, 1076 pages.
Burger, Dennis, "Automated Room Correction Explained," hometheaterreview.com, Nov. 18, 2013, Retrieved Oct. 10, 2014, 3 pages.
Chinese Patent Office, First Office Action and Translation dated Jun. 19, 2019, issued in connection with Chinese Application No. 201680054189.X, 11 pages.
Chinese Patent Office, First Office Action dated Aug. 11, 2017, issued in connection with Chinese Patent Application No. 201580013837.2, 8 pages.
Chinese Patent Office, First Office Action dated Nov. 20, 2018, issued in connection with Chinese Application No. 201580047998.3, 21 pages.
Chinese Patent Office, First Office Action dated Sep. 25, 2017, issued in connection with Chinese Patent Application No. 201580013894.0, 9 pages.
Chinese Patent Office, First Office Action dated Nov. 5, 2018, issued in connection with Chinese Application No. 201680044080.8, 5 pages.
Chinese Patent Office, Second Office Action dated Jan. 11, 2019, issued in connection with Chinese Application No. 201680044080.8, 4 pages.
Chinese Patent Office, Second Office Action dated Feb. 3, 2019, issued in connection with Chinese Application No. 201580048594.6, 11 pages.
Chinese Patent Office, Second Office Action with Translation dated Jan. 9, 2018, issued in connection with Chinese Patent Application No. 201580013837.2, 10 pages.
Chinese Patent Office, Third Office Action dated Apr. 11, 2019, issued in connection with Chinese Application No. 201580048594.6, 4 pages.
"Constellation Acoustic System: a revolutionary breakthrough in acoustical design," Meyer Sound Laboratories, Inc. 2012, 32 pages.
"Constellation Microphones," Meyer Sound Laboratories, Inc. 2013, 2 pages.
Corrected Notice of Allowability dated Jan. 19, 2017, issued in connection with U.S. Appl. No. 14/826,873, filed Aug. 14, 2015, 11 pages.
Daddy, B., "Calibrating Your Audio with a Sound Pressure Level (SPL) Meter," Blue-ray.com, Feb. 22, 2008 Retrieved Oct. 10, 2014, 15 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
European Patent Office, European Examination Report dated May 11, 2018, issued in connection with European Application No. 16748186.0, 6 pages.
European Patent Office, European Extended Search Report dated Oct. 16, 2018, issued in connection with European Application No. 17185193.4, 6 pages.
European Patent Office, European Extended Search Report dated Jul. 17, 2019, issued in connection with European Application No. 19167365.6, 7 pages.
European Patent Office, European Extended Search Report dated Jun. 26, 2018, issued in connection with European Application No. 18171206.8, 9 pages.
European Patent Office, European Extended Search Report dated Sep. 8, 2017, issued in connection with European Application No. 17000460.0, 8 pages.
European Patent Office, European Office Action dated Dec. 11, 2018, issued in connection with European Application No. 15778787.0, 6 pages.
European Patent Office, European Office Action dated Jul. 11, 2019, issued in connection with European Application No. 15778787.0, 10 pages.
European Patent Office, European Office Action dated Nov. 2, 2018, issued in connection with European Application No. 18171206.8, 6 pages.
European Patent Office, European Office Action dated Feb. 4, 2019, issued in connection with European Application No. 17703876.7, 9 pages.
European Patent Office, European Office Action dated May 9, 2019, issued in connection with European Application No. 18171206.8, 7 pages.
European Patent Office, European Partial Search Report dated Jun. 7, 2019, issued in connection with European Application No. 19161826.3, 17 pages.
European Patent Office, European Search Report dated Jun. 13, 2019, issued in connection with European Application No. 18204450.3, 11 pages.
European Patent Office, European Search Report dated Jan. 18, 2018, issued in connection with European Patent Application No. 17185193.4, 9 pages.
European Patent Office, European Search Report dated Jul. 9, 2019, issued in connection with European Application No. 19168800.1, 12 pages.
European Patent Office, Extended European Search Report dated Jan. 5, 2017, issued in connection with European Patent Application No. 15765555.6, 8 pages.
European Patent Office, Extended Search Report dated Jan. 25, 2017, issued in connection with European Application No. 15765548.1, 7 pages.
European Patent Office, Extended Search Report dated Apr. 26, 2017, issued in connection with European Application No. 15765548.1, 10 pages.
European Patent Office, Office Action dated Nov. 12, 2018, issued in connection with European Application No. 17000460.0, 6 pages.

* cited by examiner

CALIBRATION OF AUDIO PLAYBACK DEVICES

FIELD OF THE DISCLOSURE

The disclosure is related to consumer goods and, more particularly, to methods, systems, products, features, services, and other elements directed to media playback or some aspect thereof.

BACKGROUND

Options for accessing and listening to digital audio in an out-loud setting were limited until in 2003, when SONOS, Inc. filed for one of its first patent applications, entitled "Method for Synchronizing Audio Playback between Multiple Networked Devices," and began offering a media playback system for sale in 2005. The Sonos Wireless HiFi System enables people to experience music from many sources via one or more networked playback devices. Through a software control application installed on a smartphone, tablet, or computer, one can play audio in any room that has a networked playback device. Additionally, using the control device, for example, different songs can be streamed to each room with a playback device, rooms can be grouped together for synchronous playback, or the same song can be heard in all rooms synchronously.

Given the ever growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings where:

Figure 1:
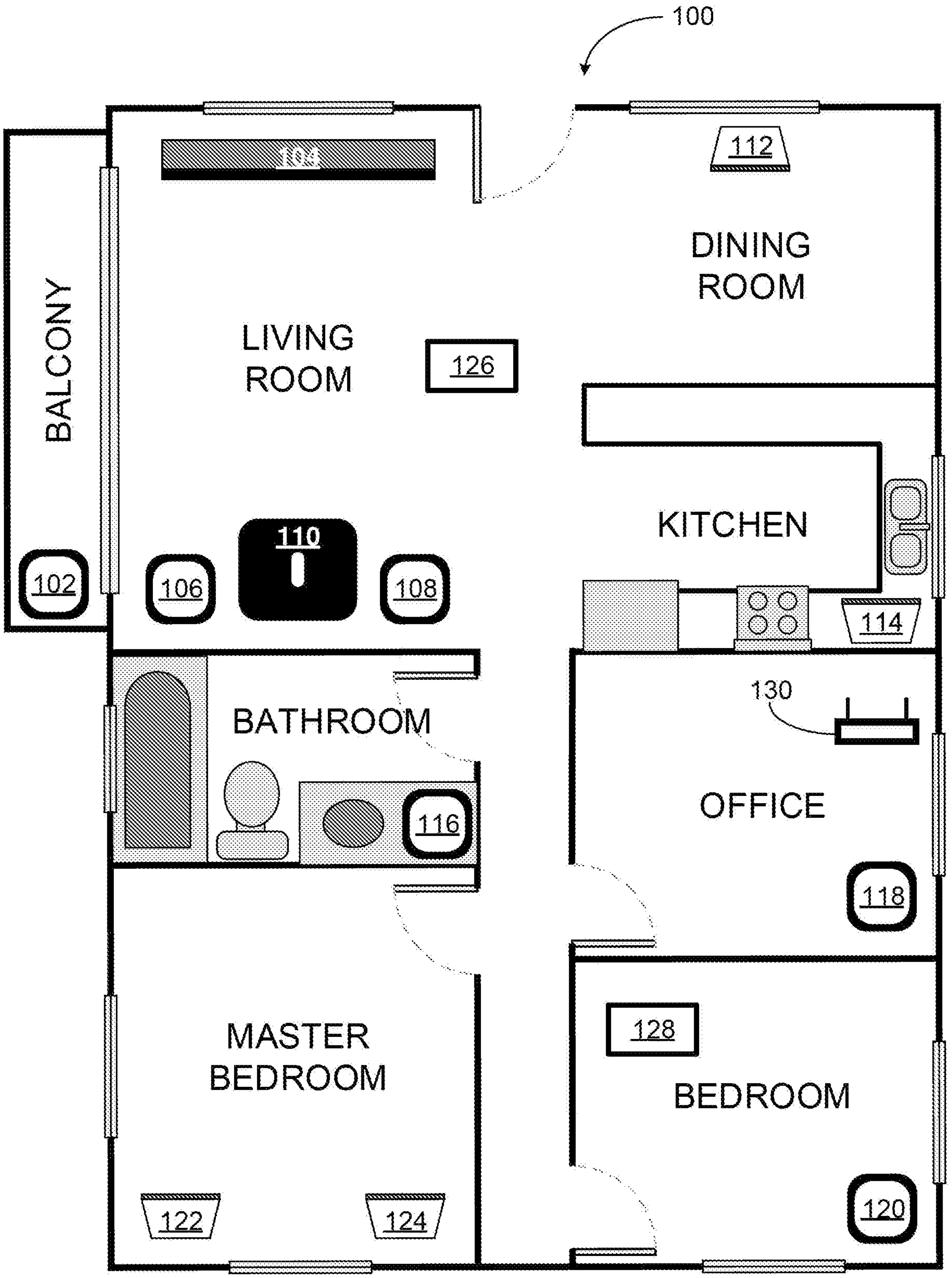
FIG. 1 shows an example playback system configuration in which certain embodiments may be practiced.

The drawings are for the purpose of illustrating example embodiments, but it is understood that the embodiments are not limited to the arrangements and instrumentality shown in the drawings.

DETAILED DESCRIPTION

I. Overview

Rooms have certain acoustics which define how sound travels within the room. The acoustics may be defined by a size and a shape of a room and objects in a room. For example, angles of walls with respect to a ceiling affect how sound reflects off the wall and the ceiling. As another example, position of furniture in the room affects how the sound travels in the room. The acoustics may also be defined by a type of surface in the room. Hard surfaces in the room may reflect sound whereas soft surfaces may absorb sound.

The room may be an environment where a playback device is located. The room could be a living room or bedroom, for instance. The playback device may have one or more speakers to play audio content in the room. It may be desirable to calibrate the playback device for the room so that the audio output by the playback device accounts for the acoustics of the room. This calibration may improve a listening experience in the room.

The calibration process may involve a playback device in the room outputting audio content. The audio content may take the form of sound having predefined spectral content. Then, the audio content may be detected at one or more different spatial positions in the room to determine an acoustic response of the room (also referred to herein as a "room response"). For example, a microphone may be moved to the various locations in the room to detect the audio content. The locations where microphone are moved to may be those locations where one or more listeners may experience audio playback during regular use of the playback device. In this regard, the calibration process requires a user to physically move a device with a microphone, such as a cell phone, to various locations in the room to detect the audio content at one or more spatial positions in the room. U.S. patent application Ser. No. 14/481,511, entitled "Playback Device Calibration", the contents of which is herein incorporated by reference in its entirety discloses such a playback calibration methodology which requires "walking" a microphone to various locations in the room to detect the audio content at the one or more spatial locations in the room.

The room could have one or more playback devices which play audio content such as music. Each playback device may need to be calibrated for the room. Embodiments described herein involve a calibration process which does not require detecting an acoustic response of a room at various locations in the room, for example by moving a device with a microphone to the various locations. Instead, the room response of a room is determined by applying a mapping to a microphone location response of the room. The microphone location response may be an acoustic response of a room at a particular location in the room and the room response may be based on an acoustic response of the room over one or more spatial locations that may or may not include the particular location associated with the microphone location response. In examples, the microphone location response may be based on a location of a microphone on or proximate to a playback device and the room response may be an acoustic response based on acoustic responses at various spatial locations in the room, e.g., an overall or average acoustic response of the room. Further, the room response may be used to adjust audio output by the playback device so as to calibrate the playback device for an improved listening experience in the room.

The playback devices may be part of a media playback system for playing audio content. In this regard, the media playback system may include one or more audio playback devices which play audio content, one or more controller devices for controlling the audio playback devices, and one or more computing devices such as a server which may store in a database the audio content and/or perform various processing associated with the media playback system. The historical acoustic responses may take the form of a set of historical room responses and a set of historical microphone location responses. The responses are "historical" because they relate to responses determined for rooms with various types of acoustic characteristics previously determined and stored in the database. The set of room responses and the set of microphone responses may be for one or more rooms different from where the playback device to be calibrated is located. Further, a response in the set of historical room responses may correspond to a response in the set of historical microphone location responses. For example, the room response in this set of historical room responses may be determined by "walking" the microphone at a plurality of different spatial locations in the room and determining acoustic responses at the plurality of different spatial locations. A microphone location response may correspond to this room response because it was determined based on the same audio content output used to determine the room response.

A set of mappings may be defined between the set of historical microphone location responses and the set of historical room responses. A simple example of this set of mappings might be a difference between a response of the set of historical microphone location responses and a response of the set of historical room responses. In embodiments, the set of mappings may be used to determine an approximation of a room response for the room in which a playback device is located. Each playback device in the room may determine its own room response for purposes of calibration of the playback of audio content in the room without the need to physically detect the audio at different spatial locations in the room.

In this regard, a playback device may play an audio content in a room where the playback device is located. One or more microphones of the playback device may receive an indication of the audio content that is played in the room. The one or more microphones may be in a fixed location in the room, such as on or proximate to the playback device. The received indication of audio content may be stored on the audio playback device, controller device, and/or computing device as a file such as an audio file. The microphone location response may be then derived based on the indication of the audio content. The microphone location response may take form of a power spectral density, a set of impulse responses, or bi-quad filter coefficients representative of the received indication.

A device in the media playback system may then use the microphone location response for the room in which the playback device is located to determine an approximation of the room response based on the set of mappings determined from the set of historical microphone location responses and the set of historical room responses. The process of determining the approximation may include calculating a distance between the microphone location response and a historical microphone location response in the set of historical microphone location responses. For example, each distance that is calculated may be between the microphone location response and a microphone location response in the set of historical microphone location responses. This calculation results in a vector of distances based on the set of historical microphone location responses or a subset of the set of historical microphone location responses. Then, a weighting may be calculated based on the vector of distances and applied, e.g., multiplied, to the set of mappings. The set of weighted mappings may be combined, e.g., summed, to yield a room mapping which when applied to the microphone location response results in an approximation of the room response. If the playback device is arranged with a plurality of microphones, then a room response may be calculated for each microphone based on corresponding microphone location responses and combined to yield a better approximation of the room response.

The approximation of the room response may be used to adjust audio played by the audio playback device. The room response may be used to identify an audio processing algorithm. The audio processing algorithm may be stored in a database or calculated dynamically. For example, the audio processing algorithm may take the form of a filter or equalization. U.S. patent application Ser. No. 14/481,511, entitled "Playback Device Calibration", the contents of which is herein incorporated by reference in its entirety discloses various audio processing algorithms. The filter or equalization may be applied by the playback device. Alternatively, the filter or equalization may be applied by another playback device, the computing device, and/or the controller device which then provides the processed audio content to the playback device for output. The filter or equalization may be applied to audio content played by the playback device until such time that the filter or equalization is changed or is no longer valid for the room.

An example of the use of this method and apparatus may be in a room of a home where a listener may listen to audio content such a living room or bedroom. The room may have an audio playback device which is to be calibrated to the acoustics of the room where the audio playback device is located. The playback device may output one or more audio tones with a defined spectral content. One or more microphones fixed on the playback device may detect an indication of the audio tones and one or more of the playback device, another playback device, the controller device, or the computing device may determine a microphone location response based on detecting the indication. Then, a set of historical microphone location responses and the set of mappings may be used to determine the room response of the room. For example, one or more of the computing device, the controller, and/or the playback device may calculate a distance between the microphone location response and each microphone location response of the set of historical microphone location responses, weight the set of mappings based on the distance, and combine the set of weighted mappings to produce a room mapping. The room mapping may then be applied to the microphone location response to determine the room response for the room. An audio processing algorithm can then be applied to audio content output by the playback device so as to improve a listening experience of the audio playback device in the room.

In one example, functions for the calibration may be coordinated and at least partially performed by a playback device, such as one of the one or more playback devices to be calibrated for the playback environment. The playback device may receive an indication of audio content received by the microphone on the playback device. The playback device may then identify based on the indication of the audio content an audio processing algorithm which is to be applied to audio content played by the playback device.

In another example, functions for the calibration may be coordinated and at least partially performed by a computing device. The computing device may be a server associated with a media playback system that includes the one or more playback devices, and configured to maintain information related to the media playback system. The computing device may receive from the audio playback device, an indication of audio content received by the playback device. The computing device may then identify based on the indication of the audio content an audio processing algorithm and transmit to the playback device being calibrated, an indication of the audio processing algorithm.

In yet another example, functions for the calibration may be coordinated and at least partially performed by a control device. The control device may be used to control the playback device and perform functions similar to that of the computing device. Other arrangements are also possible.

Moving on from the above illustration, an example embodiment includes an audio playback device comprising: a microphone; a speaker; a processor comprising instructions, which when executed, cause the processor to: output by the speaker first audio content; receive by the microphone an indication of the first audio content; determine a first acoustic response of a room in which the audio playback device is located based on the received indication of first audio content by the microphone; applying a mapping to the first acoustic response to identify a second acoustic response, wherein the second acoustic response is indicative of an approximated acoustic response of the room at a spatial location different from a spatial location of the microphone; and adjust based on the second acoustic response second audio content output by the speaker. The mapping may be defined by a set of first acoustic responses and a set of second acoustic responses; wherein a response of the set of first acoustic responses is an acoustic response of a given room at a fixed location and a response of the set of second acoustic responses is based on acoustic responses at a plurality of spatial locations different from the fixed location in the given room. The mapping may comprise a difference between a response of the set of first acoustic responses and a response of the set of second acoustic responses. Applying the mapping may comprises determining a distance between the first acoustic response and a response of the set of first acoustic responses. The mapping may be weighted by an acoustic configuration of the audio playback device. The first audio content and the second audio content may be different portions of a same song.

Another example embodiment may include a method of outputting first audio content by a speaker of an audio playback device; receiving an indication of the first audio content by a microphone of the audio playback device; determining a first acoustic response of a room in which the audio playback device is located based on the received indication of first audio content by the microphone; applying a mapping to the first acoustic response to identify a second acoustic response, wherein the second acoustic response is indicative of an approximated acoustic response of the room at a spatial location different from a spatial location of the microphone; and adjusting based on the second acoustic response audio content output by the speaker. The mapping may be defined by a set of first acoustic responses and a set of second acoustic responses; wherein a response of the set of first acoustic responses is an acoustic response of a given room at a fixed location and a response of the set of second acoustic responses is based on acoustic responses at a plurality of spatial locations different from the fixed location in the given room. The mapping may be a difference between a response of the set of first acoustic responses and a response of the set of second acoustic responses. Applying the mapping may comprise determining a distance between the first acoustic response and a response of the set of first acoustic responses. The mapping may be weighted by an acoustic configuration of the audio playback device. The method may further comprises storing the first acoustic response on a server in communication with the audio playback device. Applying the mapping may comprise sending the first acoustic response to a remote server in communication with the audio playback device and receiving the second acoustic response from the remote server.

In yet another example embodiment, a computer readable storage medium includes instructions for execution by a processor. The instructions, when executed, may cause the processor to implement a method comprising: outputting first audio content by a speaker of an audio playback device; receiving an indication of the first audio content by a microphone of the audio playback device; determining a first acoustic response of a room in which the audio playback device is located based on the received indication of first audio content by the microphone; applying a mapping to the first acoustic response to identify a second acoustic response, wherein the second acoustic response is indicative of an approximated acoustic response of the room at a spatial location different from a spatial location of the microphone; and adjusting based on the second acoustic response second audio content output by the audio playback device. The mapping may be defined by a set of first acoustic responses and a set of second acoustic responses; wherein a response of the set of first acoustic responses is an acoustic response of a given room at a fixed location and a response of the set of second acoustic responses is based on acoustic responses at a plurality of spatial locations different from the fixed location in the given room. The mapping may be a difference between a response of the set of first acoustic responses and a response of the set of second acoustic responses. Applying the mapping may comprise determining a distance between the first acoustic response and a response of the set of first acoustic responses. The mapping may be weighted by an acoustic configuration of the audio playback device. The first audio content and the second audio content may be different portions of a same song. Applying the mapping may comprise sending the first acoustic response to a remote server in communication with the audio playback device and receiving the second acoustic response from the remote server.

II. Example Operating Environment

FIG. 1 shows an example configuration of a media playback system 100 in which one or more embodiments disclosed herein may be practiced or implemented. The media playback system 100 as shown is associated with an example home environment having several rooms and spaces, such as for example, a master bedroom, an office, a dining room, and a living room. As shown in the example of FIG. 1, the media playback system 100 includes playback devices 102-124, control devices 126 and 128, and a wired or wireless network router 130.

Further discussions relating to the different components of the example media playback system 100 and how the different components may interact to provide a user with a media experience may be found in the following sections. While discussions herein may generally refer to the example media playback system 100, technologies described herein are not limited to applications within, among other things, the home environment as shown in FIG. 1. For instance, the technologies described herein may be useful in environments where multi-zone audio may be desired, such as, for example, a commercial setting like a restaurant, mall or airport, a vehicle like a sports utility vehicle (SUV), bus or car, a ship or boat, an airplane, and so on.

a. Example Playback Devices

Figure 2:
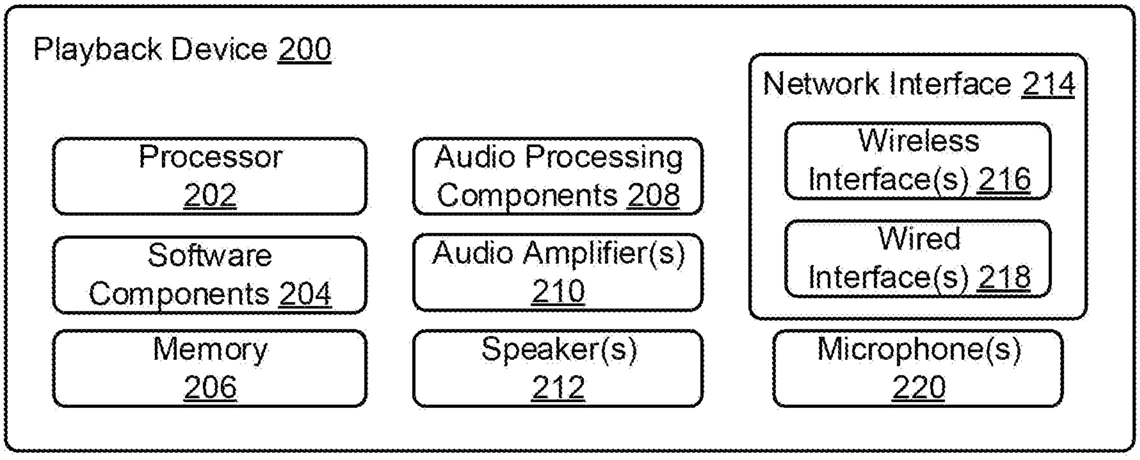
FIG. 2 shows a functional block diagram of an example playback device.

FIG. 2 shows a functional block diagram of an example playback device 200 that may be configured to be one or more of the playback devices 102-124 of the media playback system 100 of FIG. 1. The playback device 200 may include a processor 202, software components 204, memory 206, audio processing components 208, audio amplifier(s) 210, speaker(s) 212, a network interface 214 including wireless interface(s) 216 and wired interface(s) 218, and microphone(s) 220. In one case, the playback device 200 may not include the speaker(s) 212, but rather a speaker interface for connecting the playback device 200 to external speakers. In another case, the playback device 200 may include neither the speaker(s) 212 nor the audio amplifier(s) 210, but rather an audio interface for connecting the playback device 200 to an external audio amplifier or audio-visual receiver.

In one example, the processor 202 may be a clock-driven computing component configured to process input data according to instructions stored in the memory 206. The memory 206 may be a tangible computer-readable medium configured to store instructions executable by the processor 202. For instance, the memory 206 may be data storage that can be loaded with one or more of the software components 204 executable by the processor 202 to achieve certain functions. In one example, the functions may involve the playback device 200 retrieving audio data from an audio source or another playback device. In another example, the functions may involve the playback device 200 sending audio data to another device or playback device on a network. In yet another example, the functions may involve pairing of the playback device 200 with one or more playback devices to create a multi-channel audio environment.

Certain functions may involve the playback device 200 synchronizing playback of audio content with one or more other playback devices. During synchronous playback, a listener will preferably not be able to perceive time-delay differences between playback of the audio content by the playback device 200 and the one or more other playback devices. U.S. Pat. No. 8,234,395 entitled, "System and method for synchronizing operations among a plurality of independently clocked digital data processing devices," which is hereby incorporated by reference, provides in more detail some examples for audio playback synchronization among playback devices.

The memory 206 may further be configured to store data associated with the playback device 200, such as one or more zones and/or zone groups the playback device 200 is a part of, audio sources accessible by the playback device 200, or a playback queue that the playback device 200 (or some other playback device) may be associated with. The data may be stored as one or more state variables that are periodically updated and used to describe the state of the playback device 200. The memory 206 may also include the data associated with the state of the other devices of the media system, and shared from time to time among the devices so that one or more of the devices have the most recent data associated with the system. Other embodiments are also possible.

The audio processing components 208 may include one or more digital-to-analog converters (DAC), an audio preprocessing component, an audio enhancement component or a digital signal processor (DSP), and so on. In one embodiment, one or more of the audio processing components 208 may be a subcomponent of the processor 202. In one example, audio content may be processed and/or intentionally altered by the audio processing components 208 to produce audio signals. The produced audio signals may then be provided to the audio amplifier(s) 210 for amplification and playback through speaker(s) 212. Particularly, the audio amplifier(s) 210 may include devices configured to amplify audio signals to a level for driving one or more of the speakers 212. The speaker(s) 212 may include an individual transducer (e.g., a "driver") or a complete speaker system involving an enclosure with one or more drivers. A particular driver of the speaker(s) 212 may include, for example, a subwoofer (e.g., for low frequencies), a mid-range driver (e.g., for middle frequencies), and/or a tweeter (e.g., for high frequencies). In some cases, each transducer in the one or more speakers 212 may be driven by an individual corresponding audio amplifier of the audio amplifier(s) 210. In addition to producing analog signals for playback by the playback device 200, the audio processing components 208 may be configured to process audio content to be sent to one or more other playback devices for playback.

Audio content to be processed and/or played back by the playback device 200 may be received from an external source, such as via an audio line-in input connection (e.g., an auto-detecting 3.5 mm audio line-in connection) or the network interface 214.

The network interface 214 may be configured to facilitate a data flow between the playback device 200 and one or more other devices on a data network. As such, the playback device 200 may be configured to receive audio content over the data network from one or more other playback devices in communication with the playback device 200, network devices within a local area network, or audio content sources over a wide area network such as the Internet. In one example, the audio content and other signals transmitted and received by the playback device 200 may be transmitted in the form of digital packet data containing an Internet Protocol (IP)-based source address and IP-based destination addresses. In such a case, the network interface 214 may be configured to parse the digital packet data such that the data destined for the playback device 200 is properly received and processed by the playback device 200.

As shown, the network interface 214 may include wireless interface(s) 216 and wired interface(s) 218. The wireless interface(s) 216 may provide network interface functions for the playback device 200 to wirelessly communicate with other devices (e.g., other playback device(s), speaker(s), receiver(s), network device(s), control device(s) within a data network the playback device 200 is associated with) in accordance with a communication protocol (e.g., any wireless standard including IEEE 802.11a, 802.11b, 802.11g, 802.11n, 802.11ac, 802.15, 4G mobile communication standard, and so on). The wired interface(s) 218 may provide network interface functions for the playback device 200 to communicate over a wired connection with other devices in accordance with a communication protocol (e.g., IEEE 802.3). While the network interface 214 shown in FIG. 2 includes both wireless interface(s) 216 and wired interface(s) 218, the network interface 214 may in some embodiments include only wireless interface(s) or only wired interface(s).

The microphone(s) 220 may be arranged to detect sound in the environment of the playback device 200. For instance, the microphone(s) may be mounted on an exterior wall of a housing of the playback device. The microphone(s) may be any type of microphone now known or later developed such as a condenser microphone, electret condenser microphone, or a dynamic microphone. The microphone(s) may be sensitive to a portion of the frequency range of the speaker(s) 220. One or more of the speaker(s) 220 may operate in reverse as the microphone(s) 220. In some aspects, the playback device 200 might not have microphone(s) 220.

In one example, the playback device 200 and one other playback device may be paired to play two separate audio components of audio content. For instance, playback device 200 may be configured to play a left channel audio component, while the other playback device may be configured to play a right channel audio component, thereby producing or enhancing a stereo effect of the audio content. The paired playback devices (also referred to as "bonded playback devices") may further play audio content in synchrony with other playback devices.

In another example, the playback device 200 may be sonically consolidated with one or more other playback devices to form a single, consolidated playback device. A consolidated playback device may be configured to process and reproduce sound differently than an unconsolidated playback device or playback devices that are paired, because a consolidated playback device may have additional speaker drivers through which audio content may be rendered. For instance, if the playback device 200 is a playback device designed to render low frequency range audio content (i.e. a subwoofer), the playback device 200 may be consolidated with a playback device designed to render full frequency range audio content. In such a case, the full frequency range playback device, when consolidated with the low frequency playback device 200, may be configured to render only the mid and high frequency components of audio content, while the low frequency range playback device 200 renders the low frequency component of the audio content. The consolidated playback device may further be paired with a single playback device or yet another consolidated playback device.

By way of illustration, SONOS, Inc. presently offers (or has offered) for sale certain playback devices including a "PLAY:1," "PLAY:3," "PLAY:5," "PLAYBAR," "CONNECT:AMP," "CONNECT," and "SUB." Any other past, present, and/or future playback devices may additionally or alternatively be used to implement the playback devices of example embodiments disclosed herein. Additionally, it is understood that a playback device is not limited to the example illustrated in FIG. 2 or to the SONOS product offerings. For example, a playback device may include a wired or wireless headphone. In another example, a playback device may include or interact with a docking station for personal mobile media playback devices. In yet another example, a playback device may be integral to another device or component such as a television, a lighting fixture, or some other device for indoor or outdoor use.

b. Example Playback Zone Configurations

Referring back to the media playback system 100 of FIG. 1, the environment may have one or more playback zones, each with one or more playback devices. The media playback system 100 may be established with one or more playback zones, after which one or more zones may be added, or removed to arrive at the example configuration shown in FIG. 1. Each zone may be given a name according to a different room or space such as an office, bathroom, master bedroom, bedroom, kitchen, dining room, living room, and/or balcony. In one case, a single playback zone may include multiple rooms or spaces. In another case, a single room or space may include multiple playback zones.

As shown in FIG. 1, the balcony, dining room, kitchen, bathroom, office, and bedroom zones each have one playback device, while the living room and master bedroom zones each have multiple playback devices. In the living room zone, playback devices 104, 106, 108, and 110 may be configured to play audio content in synchrony as individual playback devices, as one or more bonded playback devices, as one or more consolidated playback devices, or any combination thereof. Similarly, in the case of the master bedroom, playback devices 122 and 124 may be configured to play audio content in synchrony as individual playback devices, as a bonded playback device, or as a consolidated playback device.

In one example, one or more playback zones in the environment of FIG. 1 may each be playing different audio content. For instance, the user may be grilling in the balcony zone and listening to hip hop music being played by the playback device 102 while another user may be preparing food in the kitchen zone and listening to classical music being played by the playback device 114. In another example, a playback zone may play the same audio content in synchrony with another playback zone. For instance, the user may be in the office zone where the playback device 118 is playing the same rock music that is being playing by playback device 102 in the balcony zone. In such a case, playback devices 102 and 118 may be playing the rock music in synchrony such that the user may seamlessly (or at least substantially seamlessly) enjoy the audio content that is being played out-loud while moving between different playback zones. Synchronization among playback zones may be achieved in a manner similar to that of synchronization among playback devices, as described in previously referenced U.S. Pat. No. 8,234,395.

As suggested above, the zone configurations of the media playback system 100 may be dynamically modified, and in some embodiments, the media playback system 100 supports numerous configurations. For instance, if a user physically moves one or more playback devices to or from a zone, the media playback system 100 may be reconfigured to accommodate the change(s). For instance, if the user physically moves the playback device 102 from the balcony zone to the office zone, the office zone may now include both the playback device 118 and the playback device 102. The playback device 102 may be paired or grouped with the office zone and/or renamed if so desired via a control device such as the control devices 126 and 128. On the other hand, if the one or more playback devices are moved to a particular area in the home environment that is not already a playback zone, a new playback zone may be created for the particular area.

Further, different playback zones of the media playback system 100 may be dynamically combined into zone groups or split up into individual playback zones. For instance, the dining room zone and the kitchen zone 114 may be combined into a zone group for a dinner party such that playback devices 112 and 114 may render audio content in synchrony. On the other hand, the living room zone may be split into a television zone including playback device 104, and a listening zone including playback devices 106, 108, and 110, if the user wishes to listen to music in the living room space while another user wishes to watch television.

c. Example Control Devices

Figure 3:
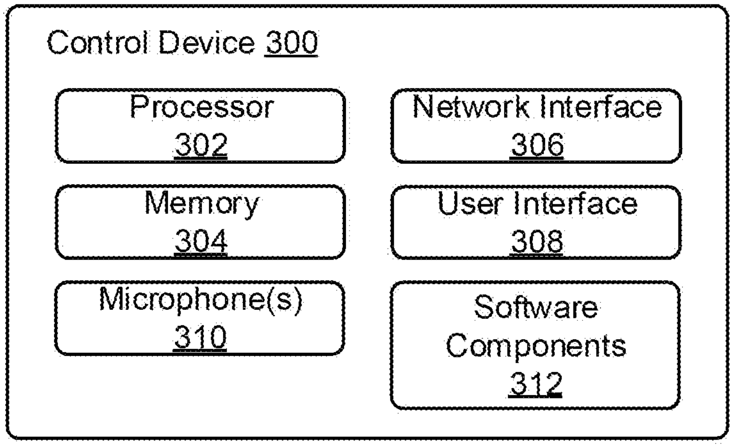
FIG. 3 shows a functional block diagram of an example control device.

FIG. 3 shows a functional block diagram of an example control device 300 that may be configured to be one or both of the control devices 126 and 128 of the media playback system 100. As shown, the control device 300 may include a processor 302, memory 304, a network interface 306, a user interface 308, microphone(s) 310, and software components 312. In one example, the control device 300 may be a dedicated controller for the media playback system 100. In another example, the control device 300 may be a network device on which media playback system controller application software may be installed, such as for example, an iPhone™, iPad™ or any other smart phone, tablet or network device (e.g., a networked computer such as a PC or Mac).

The processor 302 may be configured to perform functions relevant to facilitating user access, control, and configuration of the media playback system 100. The memory 304 may be data storage that can be loaded with one or more of the software components executable by the processor 302 to perform those functions. The memory 304 may also be configured to store the media playback system controller application software and other data associated with the media playback system 100 and the user.

In one example, the network interface 306 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on). The network interface 306 may provide a means for the control device 300 to communicate with other devices in the media playback system 100. In one example, data and information (e.g., such as a state variable) may be communicated between control device 300 and other devices via the network interface 306. For instance, playback zone and zone group configurations in the media playback system 100 may be received by the control device 300 from a playback device or another network device, or transmitted by the control device 300 to another playback device or network device via the network interface 306. In some cases, the other network device may be another control device.

Playback device control commands such as volume control and audio playback control may also be communicated from the control device 300 to a playback device via the network interface 306. As suggested above, changes to configurations of the media playback system 100 may also be performed by a user using the control device 300. The configuration changes may include adding/removing one or more playback devices to/from a zone, adding/removing one or more zones to/from a zone group, forming a bonded or consolidated player, separating one or more playback devices from a bonded or consolidated player, among others. Accordingly, the control device 300 may sometimes be referred to as a controller, whether the control device 300 is a dedicated controller or a network device on which media playback system controller application software is installed.

Control device 300 may include microphone(s) 310. Microphone(s) 310 may be arranged to detect sound in the environment of the control device 300. Microphone(s) 310 may be any type of microphone now known or later developed such as a condenser microphone, electret condenser microphone, or a dynamic microphone. The microphone(s) may be sensitive to a portion of a frequency range. Two or more microphones 310 may be arranged to capture location information of an audio source (e.g., voice, audible sound) and/or to assist in filtering background noise.

Figure 4:
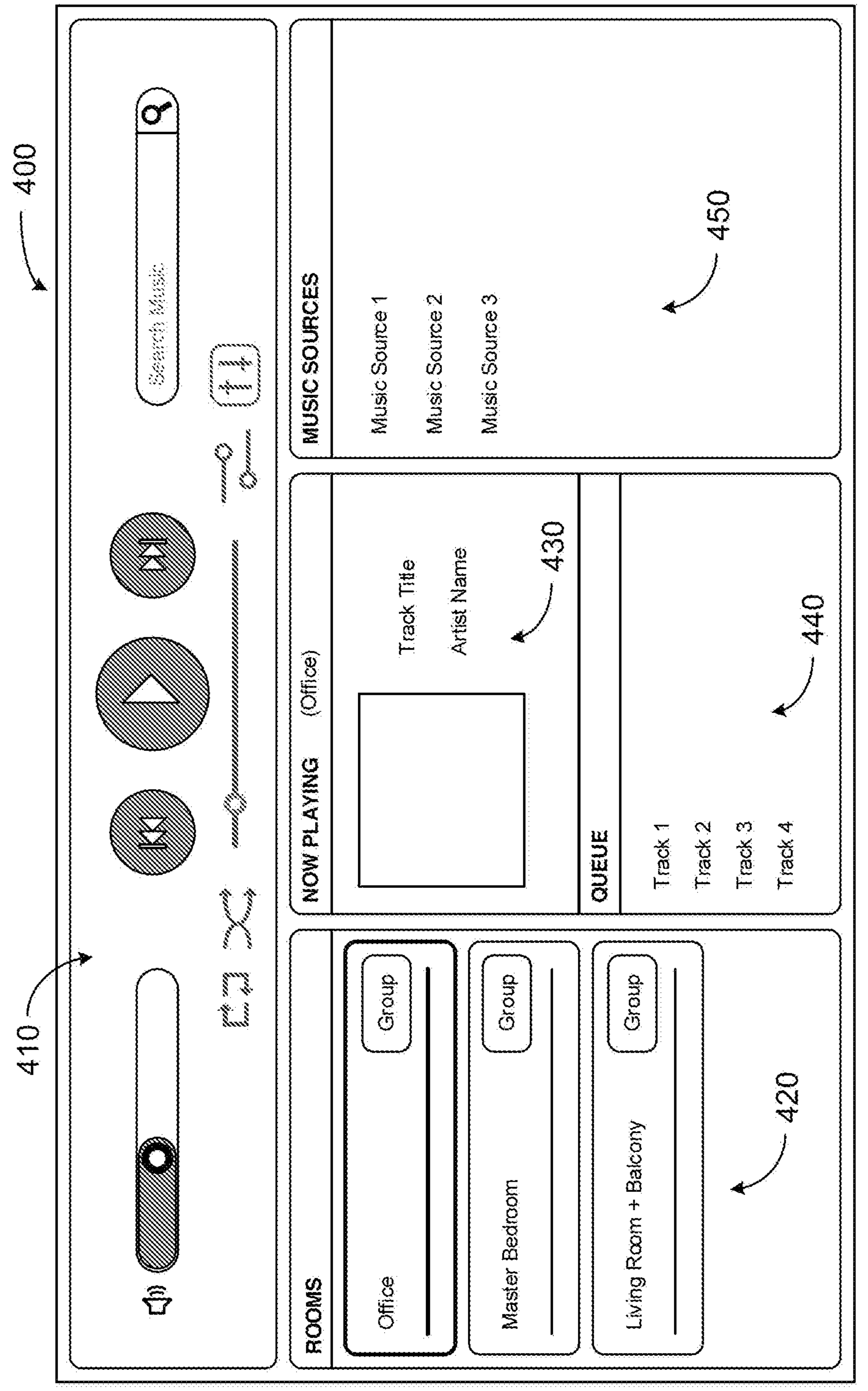
FIG. 4 shows an example control device interface.

The user interface 308 of the control device 300 may be configured to facilitate user access and control of the media playback system 100, by providing a controller interface such as the controller interface 400 shown in FIG. 4. The controller interface 400 includes a playback control region 410, a playback zone region 420, a playback status region 430, a playback queue region 440, and an audio content sources region 450. The user interface 400 as shown is just one example of a user interface that may be provided on a network device such as the control device 300 of FIG. 3 (and/or the control devices 126 and 128 of FIG. 1) and accessed by users to control a media playback system such as the media playback system 100. Other user interfaces of varying formats, styles, and interactive sequences may alternatively be implemented on one or more network devices to provide comparable control access to a media playback system.

The playback control region 410 may include selectable (e.g., by way of touch or by using a cursor) icons to cause playback devices in a selected playback zone or zone group to play or pause, fast forward, rewind, skip to next, skip to previous, enter/exit shuffle mode, enter/exit repeat mode, enter/exit cross fade mode. The playback control region 410 may also include selectable icons to modify equalization settings, and playback volume, among other possibilities.

The playback zone region 420 may include representations of playback zones within the media playback system 100. In some embodiments, the graphical representations of playback zones may be selectable to bring up additional selectable icons to manage or configure the playback zones in the media playback system, such as a creation of bonded zones, creation of zone groups, separation of zone groups, and renaming of zone groups, among other possibilities.

For example, as shown, a "group" icon may be provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone will be configured to play audio content in synchrony with the playback device(s) in the particular zone. Analogously, a "group" icon may be provided within a graphical representation of a zone group. In this case, the "group" icon may be selectable to bring up options to deselect one or more zones in the zone group to be removed from the zone group. Other interactions and implementations for grouping and ungrouping zones via a user interface such as the user interface 400 are also possible. The representations of playback zones in the playback zone region 420 may be dynamically updated as playback zone or zone group configurations are modified.

The playback status region 430 may include graphical representations of audio content that is presently being played, previously played, or scheduled to play next in the selected playback zone or zone group. The selected playback zone or zone group may be visually distinguished on the user interface, such as within the playback zone region 420 and/or the playback status region 430. The graphical representations may include track title, artist name, album name, album year, track length, and other relevant information that may be useful for the user to know when controlling the media playback system via the user interface 400.

The playback queue region 440 may include graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device.

In one example, a playlist may be added to a playback queue, in which case information corresponding to each audio item in the playlist may be added to the playback queue. In another example, audio items in a playback queue may be saved as a playlist. In a further example, a playback queue may be empty, or populated but "not in use" when the playback zone or zone group is playing continuously streaming audio content, such as Internet radio that may continue to play until otherwise stopped, rather than discrete audio items that have playback durations. In an alternative embodiment, a playback queue can include Internet radio and/or other streaming audio content items and be "in use" when the playback zone or zone group is playing those items. Other examples are also possible.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped. Other examples are also possible.

Referring back to the user interface 400 of FIG. 4, the graphical representations of audio content in the playback queue region 440 may include track titles, artist names, track lengths, and other relevant information associated with the audio content in the playback queue. In one example, graphical representations of audio content may be selectable to bring up additional selectable icons to manage and/or manipulate the playback queue and/or audio content represented in the playback queue. For instance, a represented audio content may be removed from the playback queue, moved to a different position within the playback queue, or selected to be played immediately, or after any currently playing audio content, among other possibilities. A playback queue associated with a playback zone or zone group may be stored in a memory on one or more playback devices in the playback zone or zone group, on a playback device that is not in the playback zone or zone group, and/or some other designated device.

The audio content sources region 450 may include graphical representations of selectable audio content sources from which audio content may be retrieved and played by the selected playback zone or zone group. Discussions pertaining to audio content sources may be found in the following section.

d. Example Audio Content Sources

As indicated previously, one or more playback devices in a zone or zone group may be configured to retrieve for playback audio content (e.g. according to a corresponding URI or URL for the audio content) from a variety of available audio content sources. In one example, audio content may be retrieved by a playback device directly from a corresponding audio content source (e.g., a line-in connection). In another example, audio content may be provided to a playback device over a network via one or more other playback devices or network devices.

Example audio content sources may include a memory of one or more playback devices in a media playback system such as the media playback system 100 of FIG. 1, local music libraries on one or more network devices (such as a control device, a network-enabled personal computer, or a networked-attached storage (NAS), for example), streaming audio services providing audio content via the Internet (e.g., the cloud), or audio sources connected to the media playback system via a line-in input connection on a playback device or network devise, among other possibilities.

In some embodiments, audio content sources may be regularly added or removed from a media playback system such as the media playback system 100 of FIG. 1. In one example, an indexing of audio items may be performed whenever one or more audio content sources are added, removed or updated. Indexing of audio items may involve scanning for identifiable audio items in all folders/directory shared over a network accessible by playback devices in the media playback system, and generating or updating an audio content database containing metadata (e.g., title, artist, album, track length, among others) and other associated information, such as a URI or URL for each identifiable audio item found. Other examples for managing and maintaining audio content sources may also be possible.

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

e. Example Plurality of Networked Devices

Figure 5:
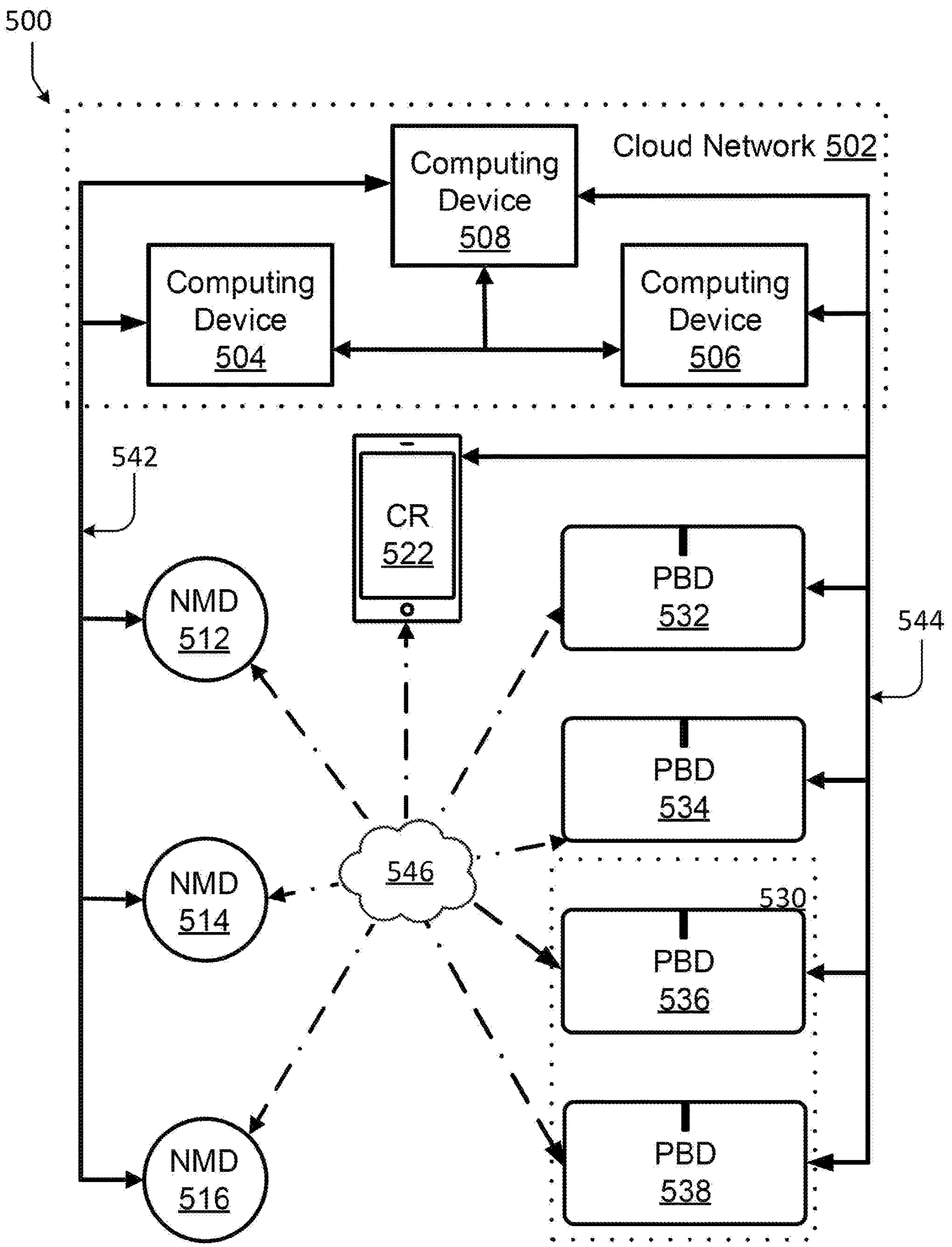
FIG. 5 shows an example network configuration in which certain embodiments may be practiced.

FIG. 5 shows an example plurality of devices 500 that may be configured to provide an audio playback experience based on voice control. One having ordinary skill in the art will appreciate that the devices shown in FIG. 5 are for illustrative purposes only, and variations including different and/or additional devices may be possible. As shown, the plurality of devices 500 includes computing devices 504, 506, and 508; network microphone devices (NMDs) 512,

514, and 516; playback devices (PBDs) 532, 534, 536, and 538; and a controller device (CR) 522.

Each of the plurality of devices 500 may be network-capable devices that can establish communication with one or more other devices in the plurality of devices according to one or more network protocols, such as NFC, Bluetooth, Ethernet, and IEEE 802.11, among other examples, over one or more types of networks, such as wide area networks (WAN), local area networks (LAN), and personal area networks (PAN), among other possibilities.

As shown, the computing devices 504, 506, and 508 may be part of a cloud network 502. The cloud network 502 may include additional computing devices. In one example, the computing devices 504, 506, and 508 may be different servers. In another example, two or more of the computing devices 504, 506, and 508 may be modules of a single server. Analogously, each of the computing device 504, 506, and 508 may include one or more modules or servers. For ease of illustration purposes herein, each of the computing devices 504, 506, and 508 may be configured to perform particular functions within the cloud network 502. For instance, computing device 508 may be a source of audio content for a streaming music service.

As shown, the computing device 504 may be configured to interface with NMDs 512, 514, and 516 via communication path 542. NMDs 512, 514, and 516 may be components of one or more "Smart Home" systems. In one case, NMDs 512, 514, and 516 may be physically distributed throughout a household, similar to the distribution of devices shown in FIG. 1. In another case, two or more of the NMDs 512, 514, and 516 may be physically positioned within relative close proximity of one another. Communication path 542 may comprise one or more types of networks, such as a WAN including the Internet, LAN, and/or PAN, among other possibilities.

In one example, one or more of the NMDs 512, 514, and 516 may be devices configured primarily for audio detection. In another example, one or more of the NMDs 512, 514, and 516 may be components of devices having various primary utilities. For instance, as discussed above in connection to FIGS. 2 and 3, one or more of NMDs 512, 514, and 516 may be the microphone(s) 220 of playback device 200 or the microphone(s) 310 of network device 300. Further, in some cases, one or more of NMDs 512, 514, and 516 may be the playback device 200 or network device 300. In an example, one or more of NMDs 512, 514, and/or 516 may include multiple microphones arranged in a microphone array.

As shown, the computing device 506 may be configured to interface with CR 522 and PBDs 532, 534, 536, and 538 via communication path 544. In one example, CR 522 may be a network device such as the network device 200 of FIG. 2. Accordingly, CR 522 may be configured to provide the controller interface 400 of FIG. 4. Similarly, PBDs 532, 534, 536, and 538 may be playback devices such as the playback device 300 of FIG. 3. As such, PBDs 532, 534, 536, and 538 may be physically distributed throughout a household as shown in FIG. 1. For illustration purposes, PBDs 536 and 538 may be part of a bonded zone 530, while PBDs 532 and 534 may be part of their own respective zones. As described above, the PBDs 532, 534, 536, and 538 may be dynamically bonded, grouped, unbonded, and ungrouped. Communication path 544 may comprise one or more types of networks, such as a WAN including the Internet, LAN, and/or PAN, among other possibilities.

In one example, as with NMDs 512, 514, and 516, CR 522 and PBDs 532, 534, 536, and 538 may also be components of one or more "Smart Home" systems. In one case, PBDs 532, 534, 536, and 538 may be distributed throughout the same household as the NMDs 512, 514, and 516. Further, as suggested above, one or more of PBDs 532, 534, 536, and 538 may be one or more of NMDs 512, 514, and 516.

The NMDs 512, 514, and 516 may be part of a local area network, and the communication path 542 may include an access point that links the local area network of the NMDs 512, 514, and 516 to the computing device 504 over a WAN (communication path not shown). Likewise, each of the NMDs 512, 514, and 516 may communicate with each other via such an access point.

Similarly, CR 522 and PBDs 532, 534, 536, and 538 may be part of a local area network and/or a local playback network as discussed in previous sections, and the communication path 544 may include an access point that links the local area network and/or local playback network of CR 522 and PBDs 532, 534, 536, and 538 to the computing device 506 over a WAN. As such, each of the CR 522 and PBDs 532, 534, 536, and 538 may also communicate with each over such an access point.

In one example, communication paths 542 and 544 may comprise the same access point. In an example, each of the NMDs 512, 514, and 516, CR 522, and PBDs 532, 534, 536, and 538 may access the cloud network 502 via the same access point for a household.

As shown in FIG. 5, each of the NMDs 512, 514, and 516, CR 522, and PBDs 532, 534, 536, and 538 may also directly communicate with one or more of the other devices via communication means 546. Communication means 546 as described herein may involve one or more forms of communication between the devices, according to one or more network protocols, over one or more types of networks, and/or may involve communication via one or more other network devices. For instance, communication means 546 may include one or more of for example, Bluetooth™ (IEEE 802.15), NFC, Wireless direct, and/or Proprietary wireless, among other possibilities.

In one example, CR 522 may communicate with NMD 512 over Bluetooth™, and communicate with PBD 534 over another local area network. In another example, NMD 514 may communicate with CR 522 over another local area network, and communicate with PBD 536 over Bluetooth. In a further example, each of the PBDs 532, 534, 536, and 538 may communicate with each other according to a spanning tree protocol over a local playback network, while each communicating with CR 522 over a local area network, different from the local playback network. Other examples are also possible.

In some cases, communication means between the NMDs 512, 514, and 516, CR 522, and PBDs 532, 534, 536, and 538 may change depending on types of communication between the devices, network conditions, and/or latency demands. For instance, communication means 546 may be used when NMD 516 is first introduced to the household with the PBDs 532, 534, 536, and 538. In one case, the NMD 516 may transmit identification information corresponding to the NMD 516 to PBD 538 via NFC, and PBD 538 may in response, transmit local area network information to NMD 516 via NFC (or some other form of communication). However, once NMD 516 has been configured within the household, communication means between NMD 516 and PBD 538 may change. For instance, NMD 516 may subsequently communicate with PBD 538 via communication path 542, the cloud network 502, and communication path 544. In another example, the NMDs and PBDs may never communicate via local communications means 546. In a further example, the NMDs and PBDs may communicate primarily via local communications means 546. Other examples are also possible.

In an illustrative example, NMDs 512, 514, and 516 may be configured to receive voice inputs to control PBDs 532, 534, 536, and 538. The available control commands may include any media playback system controls previously discussed, such as playback volume control, playback transport controls, music source selection, and grouping, among other possibilities. In one instance, NMD 512 may receive a voice input to control one or more of the PBDs 532, 534, 536, and 538. In response to receiving the voice input, NMD 512 may transmit via communication path 542, the voice input to computing device 504 for processing. In one example, the computing device 504 may convert the voice input to an equivalent text command, and parse the text command to identify a command. Computing device 504 may then subsequently transmit the text command to the computing device 506. In another example, the computing device 504 may convert the voice input to an equivalent text command, and then subsequently transmit the text command to the computing device 506. The computing device 506 may then parse the text command to identify one or more playback commands.

For instance, if the text command is "Play 'Track 1' by 'Artist 1' from 'Streaming Service 1' in 'Zone 1'," The computing device 506 may identify (i) a URL for "Track 1" by "Artist 1" available from "Streaming Service 1," and (ii) at least one playback device in "Zone 1." In this example, the URL for "Track 1" by "Artist 1" from "Streaming Service 1" may be a URL pointing to computing device 508, and "Zone 1" may be the bonded zone 530. As such, upon identifying the URL and one or both of PBDs 536 and 538, the computing device 506 may transmit via communication path 544 to one or both of PBDs 536 and 538, the identified URL for playback. One or both of PBDs 536 and 538 may responsively retrieve audio content from the computing device 508 according to the received URL, and begin playing "Track 1" by "Artist 1" from "Streaming Service 1."

One having ordinary skill in the art will appreciate that the above is just one illustrative example, and that other implementations are also possible. In one case, operations performed by one or more of the plurality of devices 500, as described above, may be performed by one or more other devices in the plurality of device 500. For instance, the conversion from voice input to the text command may be alternatively, partially, or wholly performed by another device or devices, such as NMD 512, computing device 506, PBD 536, and/or PBD 538. Analogously, the identification of the URL may be alternatively, partially, or wholly performed by another device or devices, such as NMD 512, computing device 504, PBD 536, and/or PBD 538.

f. Example Network Microphone Device

Figure 6:
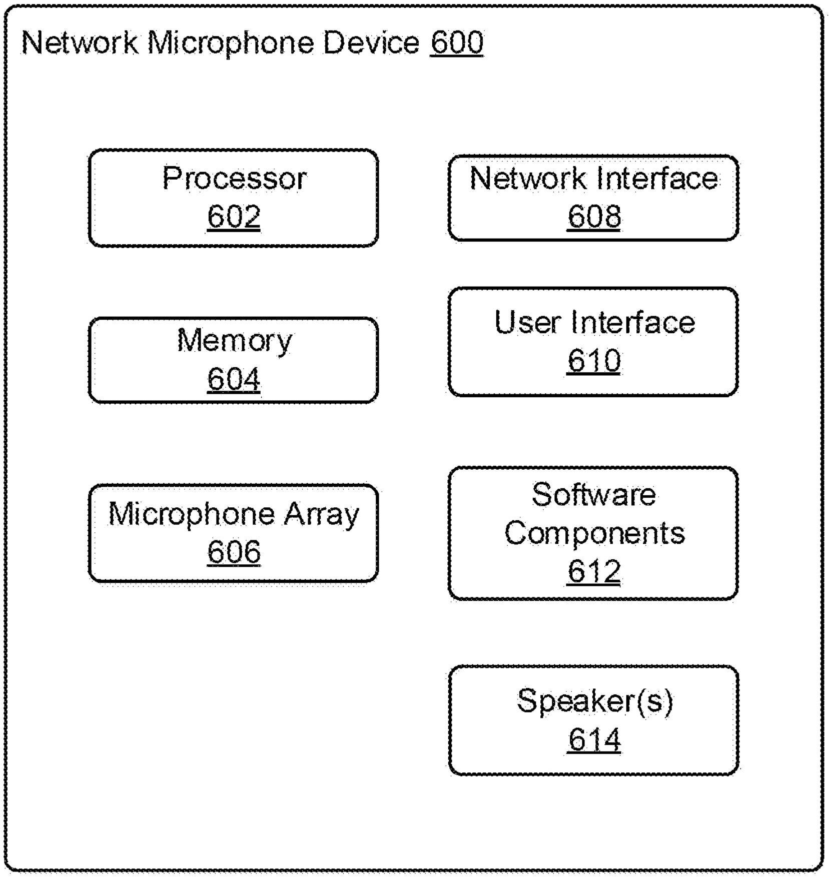
FIG. 6 shows a functional block diagram of an example network microphone device.

FIG. 6 shows a function block diagram of an example network microphone device 600 that may be configured to be one or more of NMDs 512, 514, and 516 of FIG. 5. As shown, the network microphone device 600 includes a processor 602, memory 604, a microphone array 606, a network interface 608, a user interface 610, software components 612, and speaker(s) 614. One having ordinary skill in the art will appreciate that other network microphone device configurations and arrangements are also possible. For instance, network microphone devices may alternatively exclude the speaker(s) 614 or have a single microphone instead of microphone array 606.

The processor 602 may include one or more processors and/or controllers, which may take the form of a general or special-purpose processor or controller. For instance, the processing unit 602 may include microprocessors, microcontrollers, application-specific integrated circuits, digital signal processors, and the like. The memory 604 may be data storage that can be loaded with one or more of the software components executable by the processor 602 to perform those functions. Accordingly, memory 604 may comprise one or more non-transitory computer-readable storage mediums, examples of which may include volatile storage mediums such as random access memory, registers, cache, etc. and non-volatile storage mediums such as read-only memory, a hard-disk drive, a solid-state drive, flash memory, and/or an optical-storage device, among other possibilities.

The microphone array 606 may be a plurality of microphones arranged to detect sound in the environment of the network microphone device 600. Microphone array 606 may include any type of microphone now known or later developed such as a condenser microphone, electret condenser microphone, or a dynamic microphone, among other possibilities. In one example, the microphone array may be arranged to detect audio from one or more directions relative to the network microphone device. The microphone array 606 may be sensitive to a portion of a frequency range. In one example, a first subset of the microphone array 606 may be sensitive to a first frequency range, while a second subset of the microphone array may be sensitive to a second frequency range. The microphone array 606 may further be arranged to capture location information of an audio source (e.g., voice, audible sound) and/or to assist in filtering background noise. Notably, in some embodiments the microphone array may consist of only a single microphone, rather than a plurality of microphones.

The network interface 608 may be configured to facilitate wireless and/or wired communication between various network devices, such as, in reference to FIG. 5, CR 522, PBDs 532-538, computing device 504-508 in cloud network 502, and other network microphone devices, among other possibilities. As such, network interface 608 may take any suitable form for carrying out these functions, examples of which may include an Ethernet interface, a serial bus interface (e.g., FireWire, USB 2.0, etc.), a chipset and antenna adapted to facilitate wireless communication, and/or any other interface that provides for wired and/or wireless communication. In one example, the network interface 608 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on).

The user interface 610 of the network microphone device 600 may be configured to facilitate user interactions with the network microphone device. In one example, the user interface 608 may include one or more of physical buttons, graphical interfaces provided on touch sensitive screen(s) and/or surface(s), among other possibilities, for a user to directly provide input to the network microphone device 600. The user interface 610 may further include one or more of lights and the speaker(s) 614 to provide visual and/or audio feedback to a user. In one example, the network microphone device 600 may further be configured to playback audio content via the speaker(s) 614.

III. Example Systems

Rooms have certain acoustics which define how sound travels within the room. The acoustics may be defined by a size and a shape of a room and objects in a room. For example, angles of walls with respect to a ceiling affect how sound reflects off the wall and the ceiling. As another example, position of furniture in the room affects how the sound travels in the room. The acoustics may also be defined by a type of surface in the room. Hard surfaces in the room may reflect sound whereas soft surfaces may absorb sound.

Embodiments described herein involve determining a room response by applying a mapping to a microphone location response of a room. The room may be an environment in which the playback device is located. The room could have one or more playback devices which play audio sound such as music. The microphone location response may be an acoustic response of a room at a fixed location in the room and the room response may be based on an acoustic response of the room over one or more spatial locations that may or may not include the fixed location associated with the microphone location response. In examples, the microphone location response may be based on a location of a microphone on or proximate to a playback device and the room response may be an acoustic response based on acoustic responses at various spatial locations in the room, e.g., an overall or average acoustic response of the room. The room response may be used to adjust audio output by the playback device so as to calibrate the playback device for an improved listening experience in the room.

In one example, calibration of a playback device may be initiated when the playback device is being set up for the first time in the room or if the playback device has been moved to a new location. For instance, if the playback device is moved to a new location, calibration of the playback device may be initiated based on a detection of the movement (i.e. via a global positioning system (GPS), one or more accelerometers, or wireless signal strength variations, among others), or based on a user input to indicating that the playback device has moved to a new location (i.e. a change in playback zone name associated with the playback device).

In another example, calibration of the playback device may be initiated via a controller device. For instance, a user may access a controller interface for the playback device to initiate calibration of the playback device. In one case, the user may access the controller interface, and select the playback device (or a group of playback devices that includes the playback device) for calibration. In some cases, a calibration interface may be provided as part of a playback device controller interface to allow a user to initiate playback device calibration. Other examples are also possible.

Figure 7:
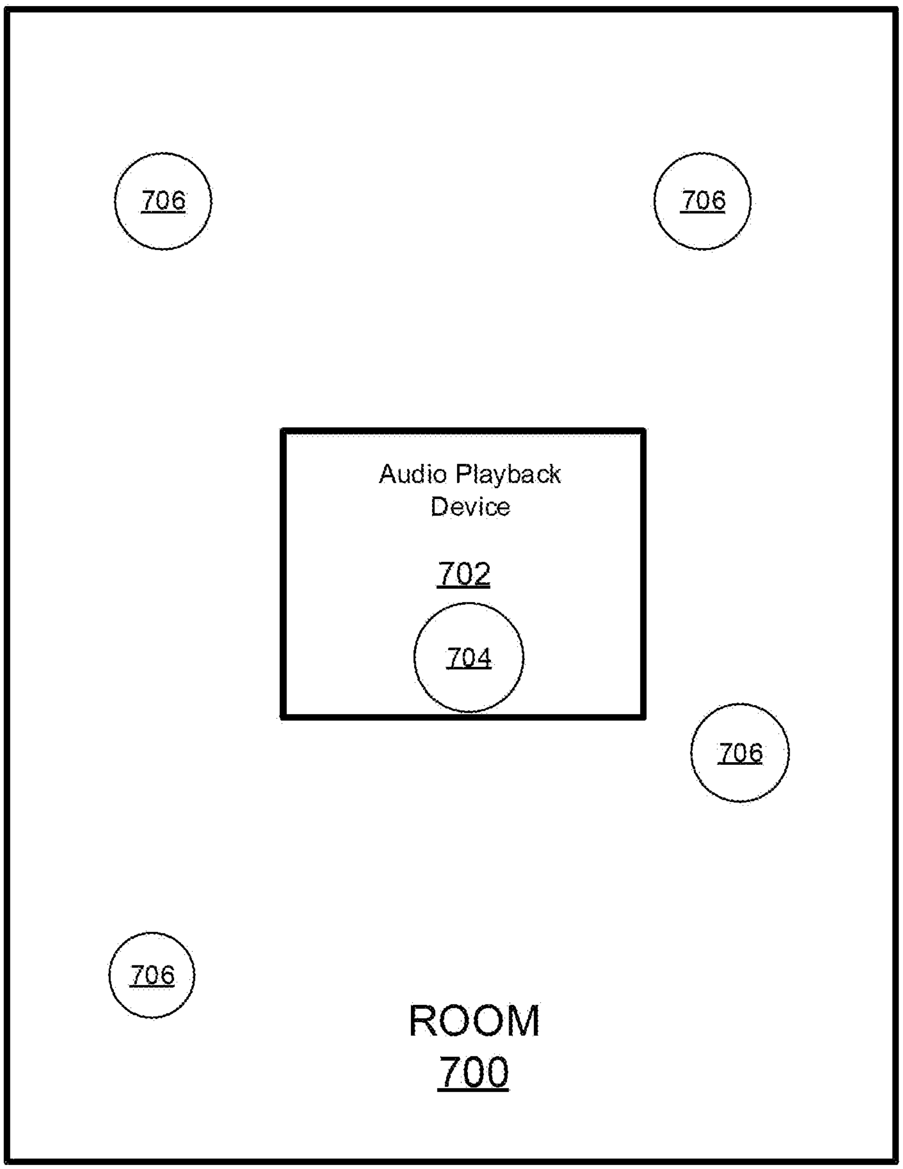
FIG. 7 shows an example environment in which certain embodiments may be practiced.

FIG. 7 illustrates an example room 700 in which the microphone location response and room response may be determined. The room 700 may have an audio playback device 702 capable of outputting one or more audio content. In one example, the audio content may be predefined spectral content such as one or more tones. In another example, the audio content may be predefined spectral content such as music. In either case, audio content may have frequencies substantially covering a renderable frequency range of the playback device, a detectable frequency range of the microphone, and/or an audible frequency range for an average human.

The audio playback device 702 may have one or more microphones 704. The microphone 704 may be fixed in location. For example, the microphone may be co-located in or on the playback device or be co-located in or on an NMD proximate to the playback device. Additionally, the one or more microphones may be oriented in one or more directions. The one or more microphones may detect an indication of audio content output by the audio playback device 702 in the one or more directions. The detected audio at the fixed location may be used to determine the microphone location response of the room.

A room response differs from the microphone location response in that the room response may be based on detecting an indication of the audio content output by the playback device at a spatial location different from that of the spatial location of the microphone 704 associated with the microphone location response. For example, the room response may be determined based on acoustic responses of the room at various spatial locations 706 in the room 700. A controller device might be used to detect the one or more audio tones output by the playback device at the plurality of positions 706. For example, the controller device may be physically moved to each of positions 706 in the room 700 and the microphone of the controller device may detect the indication of the audio content played back by the audio playback device. Additionally, or alternatively, the audio playback device may have a remote microphone which may be moveable to the different positions 706 to detect the indication of the audio content in a manner similar to that of the controller device. The detected audio at the plurality of locations 706 may be used to determine the room response for the room 700. Still additionally or alternatively, an NMD may be moved to various locations in the room to detect the indication of the audio content. Additionally, or alternatively, a plurality of NMDs fixed at various locations in the room may be used to detect the indication of the audio content.

Figure 8:
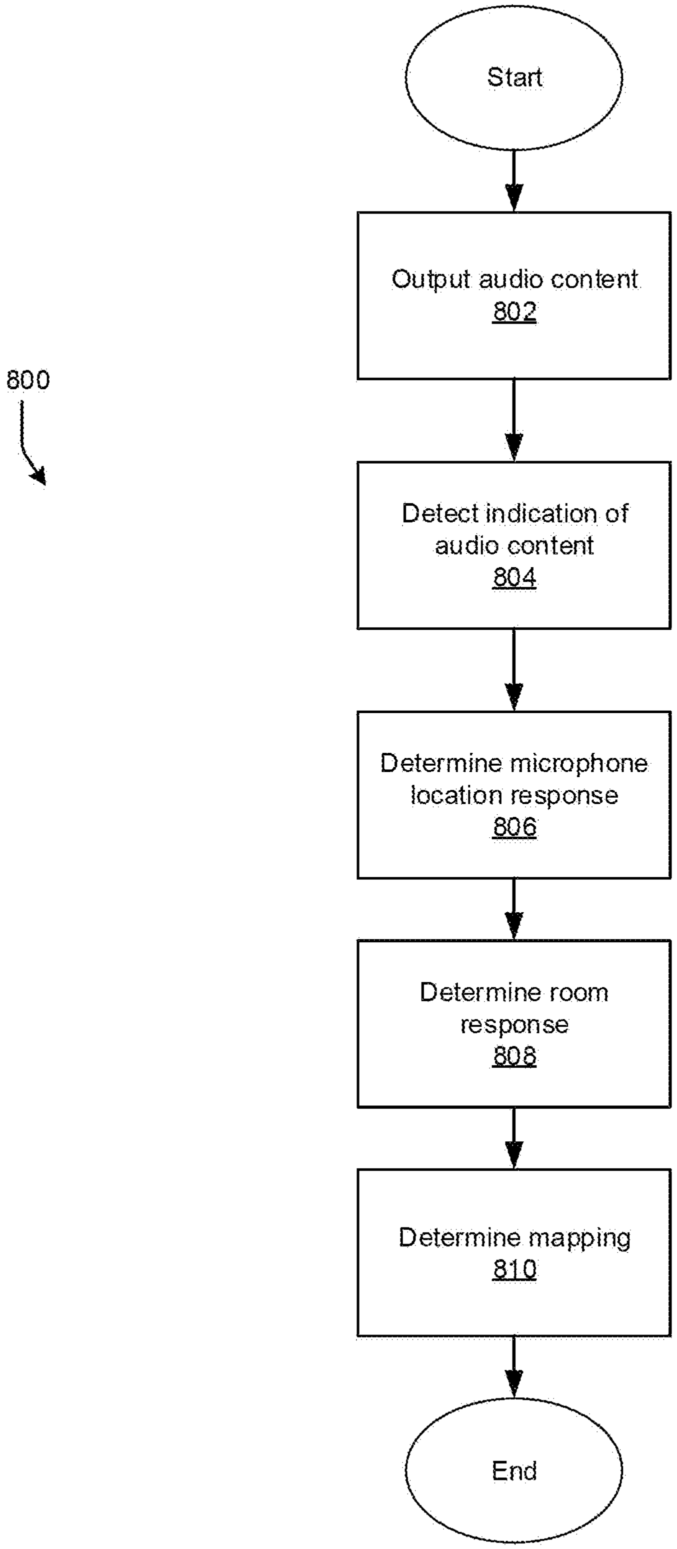
FIG. 8 shows an example flow diagram associated with determining a mapping between a microphone location response and a room response.
Figure 9:
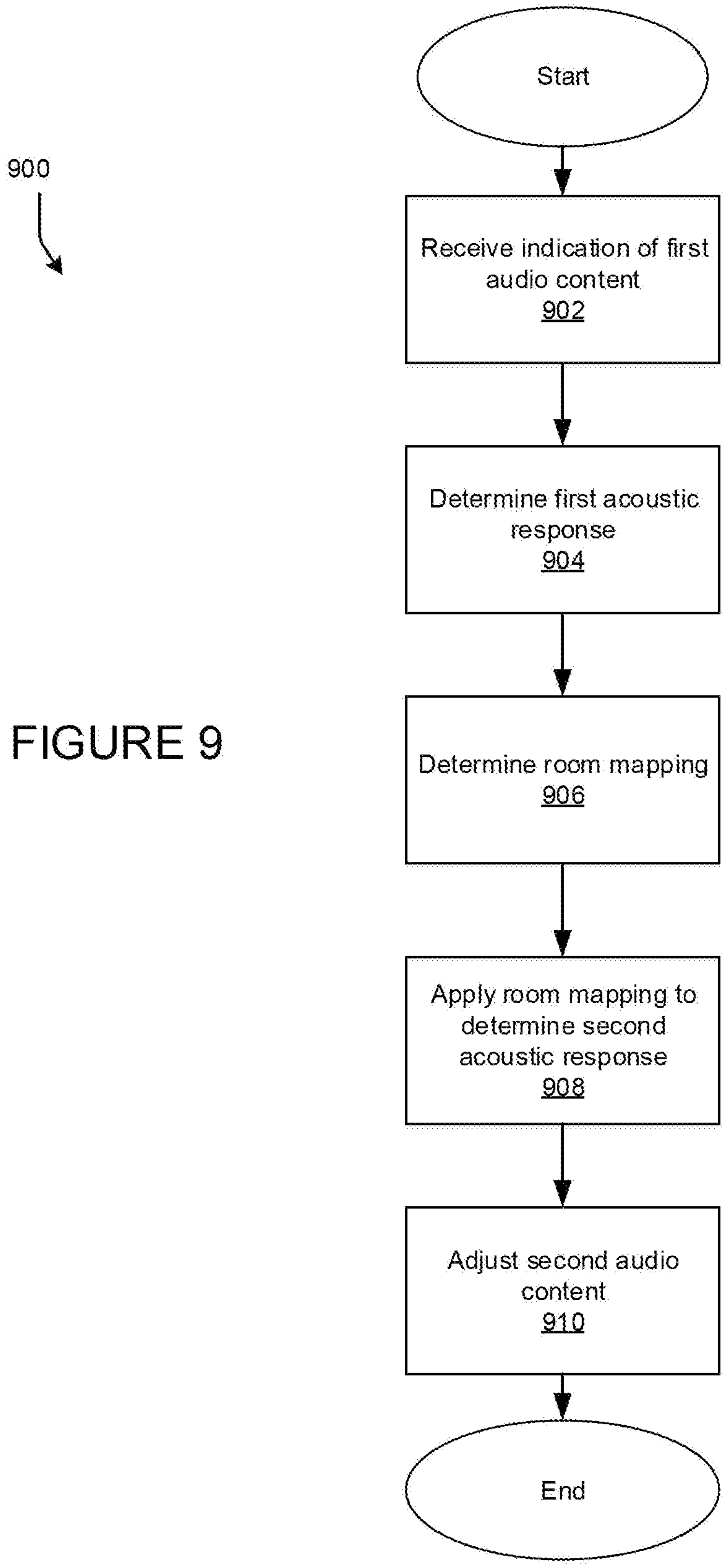
FIG. 9 shows an example flow diagram for determining a room response for a room based on a microphone location response for the room.
Figure 10:
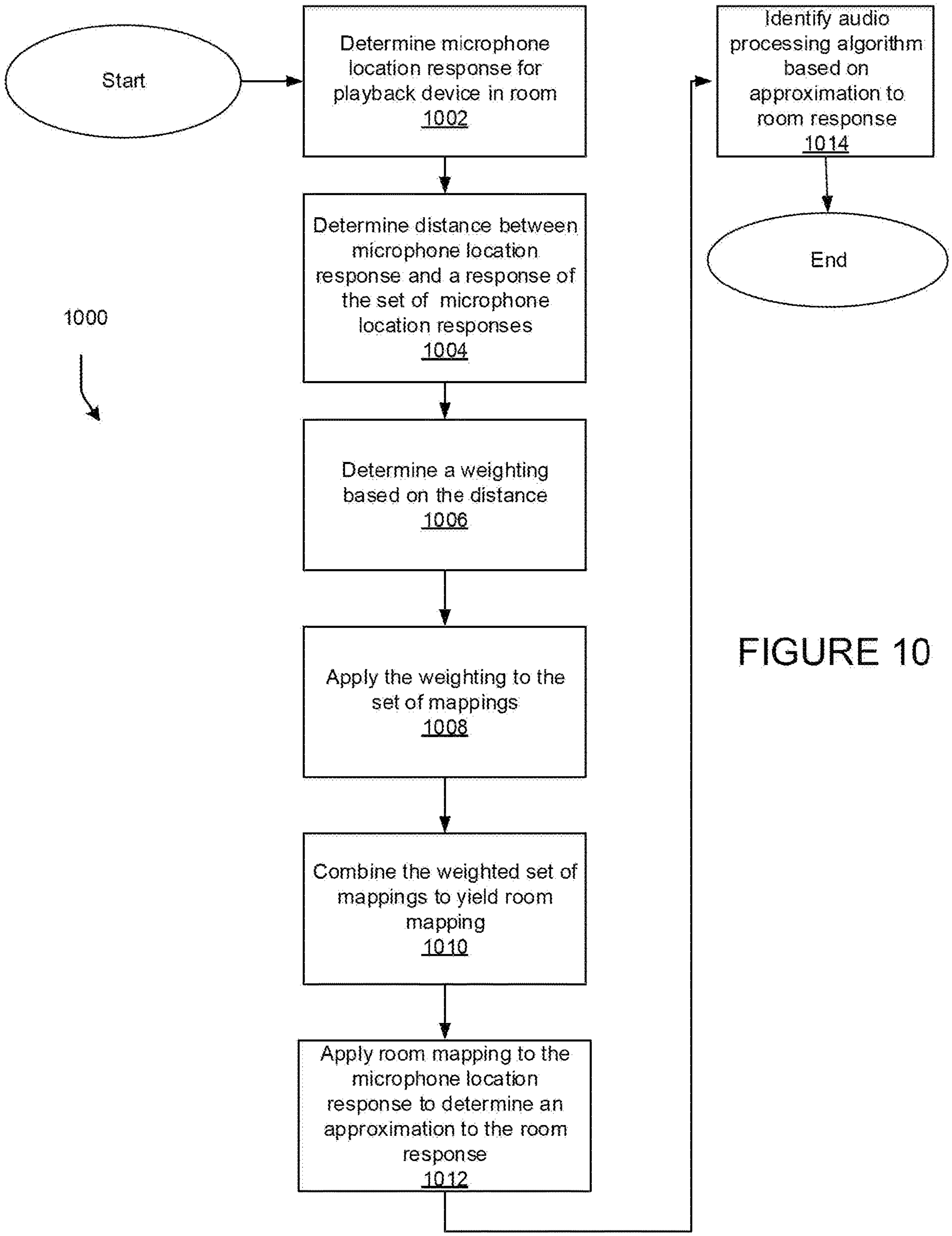
FIG. 10 shows a more detailed example flow diagram for determining the room response for the room based on the microphone location response for the room.

FIGS. 8-10 present embodiments that can be implemented within the disclosed operating environment. Methods and the other process disclosed herein may include one or more operations, functions, or actions. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the methods and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, each block in the figures may represent circuitry that is wired to perform the specific logical functions in the process.

FIG. 8 is a flow chart 800 of functions associated with determining a mapping between acoustic responses, specifically a mapping from a microphone location response to a room response, which may be used to calibrate a playback device in a room to improve a listening experience in the room.

A playback device playing audio content may facilitate determining this mapping. At 802, the playback device may output audio content. The audio content may be a pre-recorded or a generated audio tone with a specified spectral density. At 804, an indication of the audio content may be detected. At 806, a microphone location response is determined based on the indication. At 808, a room response is determined based on the indication. At 810, a mapping may be determined between the microphone location response and the room response. This process may be repeated for a plurality of rooms to generate a set of room responses and a set of microphone location responses (e.g., sets of historical responses). The set of room responses and the set of microphone location responses may be used to determine a set of mappings.

The functions of the example process shown in FIG. 8 will now be described in further detail.

Starting at 802, the playback device may output audio content. The audio content may take a variety of forms. For example, the audio content may be one or more audio tones with a predefined frequency spectrum. As another example, the audio content may be music with a predefined frequency spectrum. The audio content that is output may be stored as an audio file on the playback device, stored on another playback device, stored on the controller device, and/or stored on a computing device such as a server. In this regard, the playback device may retrieve this audio file and output the audio content. The playback device may have one or more audio speakers which are oriented in one or more directions. The playback device may output this audio in the one or more directions within the room using the one or more speakers.

At 804, an indication of the audio content may be detected. For example, one or more microphones of a controller device oriented in the same or different direction may receive an indication of the audio content being played. In another example, one or more wired or wireless microphone of the audio playback device oriented in the same or different direction may receive the indication of the audio content. In yet another example, one or more microphones of an NMD oriented in the same or different direction may receive the indication of the audio content. The detected indication at the audio playback device, controller device, or NMD may be stored as an audio file on the audio playback device, controller device, and/or computing device.

At 806, a microphone location response may be determined. The microphone location response may be an acoustic response of the room based on the detected indication of audio content at a fixed location in the room. The fixed location may be at the one or more microphone located or proximate to the audio playback device, but could also be at the microphone of an NMD or a controller device proximate to the playback device.

The microphone location response may be represented as a spectral response, spatial response, or temporal response, among others. The spectral response may be an indication of how volume of audio sound captured by the microphone varies with frequency within the room. A power spectral density is an example representation of the spectral response. The spatial response may indicate how the volume of the audio sound captured by the microphone varies with direction and/or spatial position in the room. The temporal response may be an indication of how audio sound played by the playback device, e.g., an impulse sound or tone played by the playback device, changes within the room. The change may be characterized as a reverberation, delay, decay, or phase change of the audio sound. The spatial response and temporal responses may be represented as averages in some instances. Additionally, or alternatively, the microphone location response may be represented as a set of impulse responses or bi-quad filter coefficients representative of the acoustic response, among others.

At 808, a room response may be determined. The room response may be an acoustic response of the room based on the detected indication of audio content at a spatial location different from the one or more microphones used to determine the microphone location response. The indication may be detected by one or more microphones of the playback device, controller device, or NMD. In other examples, the room response may be an acoustic response of the room based on the indication of audio content detected at a plurality of locations in the room. A microphone may be on the controller device which is moved to various spatial positions within the room to detect an indication of the audio content being played. In another example, the microphone may be a wired or wireless microphone of the audio playback device which can be moved to various spatial locations in the room to detect the indication of the audio content. In yet another example, the microphone may be an NMD which can be moved to various spatial locations in the room to detect the indication of audio content. In another example, one or more NMD situated in various locations in the room may detect the indication of the audio content.

The room response may be represented as a spectral response, spatial response, or temporal response, among others. The spectral response may be an indication of how volume of audio sound captured by the microphone varies with frequency within the room. A power spectral density is an example representation of the spectral response. The spatial response may indicate how the volume of the audio sound captured by the microphone varies with direction and/or spatial position in the room. The temporal response may be an indication of how audio sound played by the playback device, e.g., an impulse sound or tone played by the playback device, changes within the room. The change may be characterized as a reverberation, delay, decay, or phase change of the audio sound. The spatial response and temporal responses may be represented as room averages in some instances. Additionally, or alternatively, the room response may be represented as a set of impulse responses or bi-quad filter coefficients representative of the acoustic response, among others.

At 810, a mapping may be calculated between the microphone location response and the room response. The microphone location response and room response are related because they were both determined based on the same audio content played by the playback device. The mapping may define a permutation from the microphone location response to the room response. For example, the mapping might be a difference between the room response and the microphone location response. This difference might be represented as a vector of differences having a length equal to a length of the microphone location response and room response. For example, if the response is a spectral response, then the microphone location response and the room response may be subtracted for each frequency bin of the spectral response to determine the mapping. If the number of frequency bins are represented by 16 bits, then the length of the vector of differences may also be 16 bits.

As yet another example, the mapping might be a mathematical function that defines a correlation between a microphone location response and a room response. The mathematical function may enable calculating the microphone location response from a room response and vice versa. For example, the mathematical function may be a set of coefficients that defines mapping between the room response and the microphone location response. By defining the mapping in terms of a function, a vector of data, such as a vector of differences, need not be stored, thus reducing storage requirements.

The mapping process might be performed by the playback device, NMD, and/or controller device. Alternatively, the mapping process might be "cloud-based" and performed by the computing device. Still alternatively, the mapping process might be performed performed "offline" with human intervention. The mapping might be stored by one or more of the computing device, playback device, and/or controller device.

This process of determining a room response and microphone location response may be repeated for a plurality of playback devices in a plurality of rooms with different acoustic characteristics to define a set of room responses and a set of microphone location responses which are stored in a database on the audio playback device, controller device, and/or computing device. The set of room responses and the set of microphone responses may be "historical" because they relate to responses determined for rooms with various types of acoustic characteristics previously determined and stored in the database. The set of room responses and the set of microphone responses may be for one or more rooms different from where the playback device to be calibrated is located. Accordingly, the set of room responses and the set of microphone responses may also be referred to herein as a set of historical microphone location responses and a set of historical room responses.

Additionally, a set of mapping may be determined based on the set of room responses and associated set of microphone location responses. The set of mapping may take the form of vectors of data. Alternatively, the set of mappings may take the form of a multi-dimensional function. The multi-dimensional function may define respective functions for mapping each microphone location response of the set of microphone location responses to a corresponding room response of the set of room responses. Other arrangements are also possible.

The mapping may be used to determine an approximation of a room response for a room in which an audio playback device is located without needing to detect an indication of audio content at a spatial location different from a location where a microphone location response is determined in the room.

FIG. 9 is a flow chart 900 of functions that may be performed for determining a room response for a playback device in the room in accordance with embodiments. At 902, an indication of first audio content is received. The playback device may play the first audio content, e.g., one or more tones or music, and the playback device may receive the indication of the audio content using its one or more microphones. At 904, a first acoustic response may be determined. The first acoustic response may be a microphone location response for a room in which a playback device is located based on the indication.

At 906, a room mapping may be determined. The room may be one in which the playback device might not have been played in before and accordingly the room response is not known. The room mapping based on the microphone location response and the set of mappings determined in FIG. 8. The room mapping, unlike the mappings in the set of mappings, may be specific to the room in which the playback device is located. At 908, the room mapping may be applied to the microphone location response to determine a second acoustic response, e.g., room response for the room in which the playback device is located. At 910, an audio processing algorithm determined based on the second acoustic response may be applied to second audio content played by the playback device to adjust the audio content played by the playback device. The second audio content may be music or a song. In some examples, the first audio content and the second audio content may be different positions in a same song.

FIG. 10 is a flow chart 1000 of functions that describes in more detail the functions recited in FIG. 9 that may be performed for determining a room response for a playback device in the room.

Referring to FIG. 10, at 1002, a microphone location response for the playback device in the room may be determined. Similar to the process described above, a playback device placed in a room may play back audio content. The audio content played back by the playback device may be known audio content such as a tone or plurality of tones with a defined spectral density or predefined music. The playback device may have one or more microphones. The one or more microphones may receive an indication of the audio content played by the playback device and detect the indication of the audio content. The detected audio content may be stored on the playback device, another playback device in the media playback system, the computing device, and/or the controller device as an audio file. The detected audio content may be used to determine the microphone location response. The microphone location response may be an acoustic response that takes the form a spectral response, a spatial response, or a temporal response. The microphone location response may be stored as a digital file, a power spectral density, an impulse response, a bi-quad filter, or some other representation appropriate for the microphone location response.

A device, e.g., playback device, controller device, and/or cloud based computing device, in the media playback system may then use the microphone location response to determine an approximation of the room response based on the set of mappings determined from the set of microphone location responses and the set of room responses determined in FIG. 8.

At 1004, a distance is determined between the microphone location response and a microphone location response in the set of microphone location responses. For example, each distance that is calculated may be between the microphone location response determined at 1002 and a microphone location response in the set of microphone location responses. This calculation results in a vector of distances based on the set of microphone location responses or a subset of the set of microphone location responses. The distance may be any type of multidimensional distance metric which may include, for example, a clustering algorithm such as K-means or a classification algorithm such as a support vector machine (SVM).

At 1006, a weighting may be determined based on the distance. In one example, each weighting may be an inverse to a distance or an inverse of a squared distance such that a vector of weightings of length equal to the distance vector may be calculated. In another example, each weighing may be based on an acoustic configuration of the playback device. A state variable may be defined a user during an initialization of the playback device or set by the controller device in some instances. The state variable might indicate, for example, that the playback device is on a floor, on a shelf, in a cabinet. Additionally, the state variable may indicate an orientation of the playback device. The playback device may be defined by a housing with a long side and a short side. The orientation may indicate whether the playback device is resting on its long side (i.e., horizontal orientation) or short side (i.e., vertical orientation), or some orientation between horizontal and vertical. Still additionally, a state variable might indicate, for example, that the playback device is in a stereo pair, playing audio alone, or in a particular position in a home theater such as a subwoofer or rear speaker. The weighting may be based on the acoustic configuration.

At 1008, the weighting is then applied to each of the mappings of the set of mappings or each of the functions of mappings determined from the set of microphone location response and the set of room response determined in FIG. 8. In one example, the weighting may be applied evenly across the mappings. In this regard, if the weighing vector is based on an inverse of the distance, then the weighting vector may be multiplied to the mapping to result in a set of mappings which are weighted in favor of historical microphone location responses which are most similar to the microphone location response. In another example, the weighting may vary across the mappings. For instance, the weighing may vary with respect to frequency. The variation may be continuous or a step function in which case certain frequency spectrums might be weighed more heavily or less heavily than other frequency spectrums. Additionally, or alternatively, an a priori weighing might be used. For example, certain microphone location responses in the set of microphone location responses may be more common than other microphone location responses because they are representative of typical rooms with typical acoustic characteristics. Those mappings in the set of mappings associated with the more common microphone location responses may be weighted more heavily than those responses associated with the less common microphone location responses.

In other embodiments, a weighting might not be applied to the mapping and instead a closest microphone location response in the set of microphone location responses may be found to the microphone location response determined at 1002. The closest may be that having a smallest distance of the distances determined at 1004. The room response in the set of room responses corresponding to the closest microphone location response may be used as the approximation of the room response.

At 1010, the weighted mappings may be combined, e.g., summed and/or multiplied, to yield a room mapping. The room mapping may define a relationship between the microphone location response for the room and an approximation of the room response for the room.

At 1012, the room mapping may be applied to the microphone location response determined at 1002 to determine an approximation of the room response. The approximation of the room response may be represented as impulse response. For example, if the set of mappings is based on a difference between a room response and a microphone location response of the sets, then the approximation to the room response may be calculated by summing the weighted mappings and adding the summed weighted mappings to the microphone location response. Accordingly, a room response may be determined without having to actually detect audio played back by the audio playback device at a spatial location in the room different from where the microphone location response was determined.

The playback device may have a plurality of microphones. In one example, the indication of audio content from each microphone may be combined to form a single indication prior to determining the microphone location response. Then, a room response is determined in accordance with functions 1002 to 1012. In another example, a microphone location response may be determined for each microphone. Then, a room response may be determined for each microphone location response. In this embodiment, each of the room responses for each microphone may be combined, e.g., averaged, to yield a better approximation of the room response. This room response may be statistically better by a square root of the number of microphones used to determine the room response.

The approximation of the room response may be further corrected. For example, the correction may be a speaker equalization, a microphone equalization, content equalization. The correction may also be corrected based on placement of the playback device. Additionally, the room response may be inverted, weighted, capped, or normalized. Other arrangements are also possible.

At 1014, an audio processing algorithm may be identified based on the approximated room response. In one example, the audio processing algorithm may be selected from a database of audio processing algorithms. In another example, the audio processing algorithm may be dynamically computed. The audio processing algorithm may take the form of a filter or equalization to adjust an acoustic response of the audio playback device in the room being calibrated. This filter or equalization may be applied to the audio content played by the playback device until such time that the filter or equalization is changed or is no longer valid for the room.

The filter or equalization may be applied by the playback device. Alternatively, the filter or equalization may be applied by another playback device, the server, and/or the controller device which then provides the processed audio content to the playback device for output via a communication network. Other arrangements are also possible.

In some embodiments, a user of the playback device may be allowed to accept or reject the calibration determined in accordance with FIGS. 9 and 10. This indication may be presented on a graphical display of the playback device or controller device, for instance.

Figure 11:
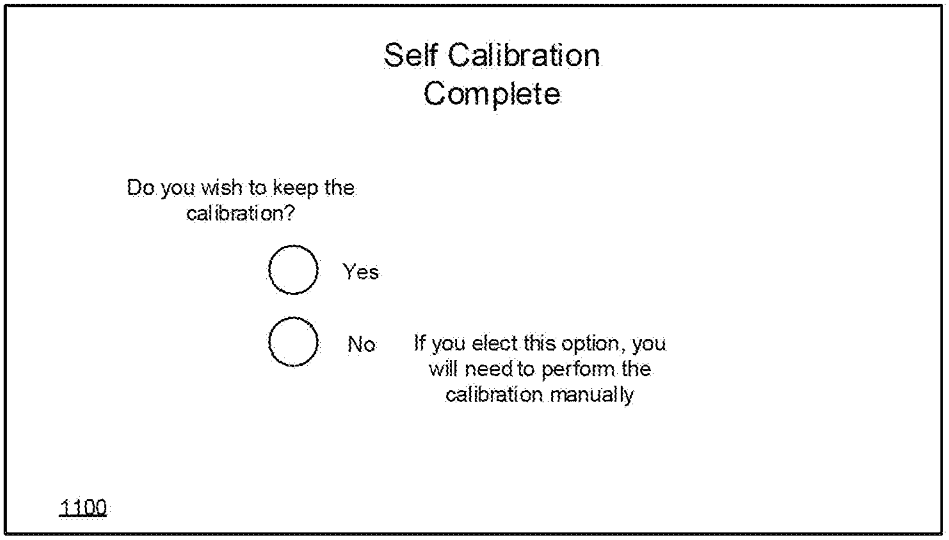
FIG. 11 illustrates and example graphical display associated with calibration.

FIG. 11 illustrates an example of this graphical display 1100. The graphical display may indicate that the calibration is complete. A user may also be requested to indicate a "yes" to apply the calibration (e.g., the determined audio processing algorithm) to playback of audio content by the playback device or "no" to not use the calibration. The user may respond to the indication by selecting a desired action. If the calibration is rejected, then the user may also be prompted to perform another calibration process. As an example, this calibration may involve the playback device outputting audio content, the user "walking" the room with a microphone, such as on the controller device, and detecting an indication of the audio content output at different spatial locations in the room, for example as described in U.S. patent application Ser. No. 14/481,511. This process may result in determining the room response which is then used to calibrate the playback device.

Further, the microphone on the playback device might also detect the audio output by the playback device when the room response is being determined. In this regard, both the microphone location response and room response may be determined by this alternative calibration and provided to the network device that hosts the set of microphone location responses and the set of room responses. The microphone location response and room response may be added to the set of historical microphone location responses and the set of historical room responses. A mapping may be determined for the microphone location response and room response which can be added to the set of mappings and used to improve the determination of a room response based on the microphone location response.

Additionally, the room response determined as a result of walking the microphone could be used to adjust the mapping from a microphone location response to the room response. For example, the rejected approximation of the room response (as a result of the rejected calibration) may be correlated to the room response that was determined as a result of walking the microphone. Based on the correlation, the mapping from the microphone response to the rejected approximation to of room response may be adjusted so as to improve subsequent calibrations of the playback device. The room response determined as a result of walking the microphone may be used in other ways as well.

In some embodiments described above, the playback device is described as having one or more microphones for determining the microphone location response. Instead of the playback device being used to determine the microphone location response, the controller device might alternatively or additionally be used. For example, the playback device may play the audio tones but the controller device may capture the audio sound for purposes of determining the microphone location response. The controller device may be stationary during this process, and in some instances, could be located proximate to the playback device.

Further, a number of test tones used in to determine the microphone location response might be less than that which would be used if the playback device was determining the microphone location response. By using less tones, the time to determine the microphone location response may be reduced. The controller device may determine the room response itself based on the detected audio or pass the detected audio to the playback device or the computing device to determine the room response. Other arrangements are also possible.

As another example, both the controller device and the playback device may be used to determine the room response. The controller device and the playback device may each have one or more microphones. A microphone location response may be determined by one or more controller devices and one or more playback devices in the room. Each microphone location response may be used to determine a corresponding approximation to the room response. The approximations of the room responses may then be combined. This way an accuracy of the room response may be improved similar to how the plurality of microphones on the playback device improves the determination of the room response.

Methods and the other process disclosed herein may include one or more operations, functions, or actions. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the methods and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, each block in the figures may represent circuitry that is wired to perform the specific logical functions in the process.

IV. Conclusion

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

The invention claimed is:

1. An audio playback device comprising:

a network interface;

a speaker;

a processor;

data storage storing instructions that when executed by the processor cause the audio playback device to perform functions comprising:

outputting, via the speaker, first audio content;

receiving, via the network interface from a mobile device, data representing one or more reflections of the first audio content in a given environment as captured by a microphone of the mobile device, wherein the mobile device is located within the given environment at a first spatial location, and wherein the microphone is on or proximate to the mobile device;

determining a first acoustic response comprising a microphone response representing an acoustic response of the given environment as measured at the first spatial location within the given environment by the mobile device;

based on the first acoustic response, determining a mapping from the first acoustic response to a corresponding second acoustic response comprising a mapped room response, wherein the second acoustic response approximates an acoustic response of the given environment as measured at one or more second spatial locations, wherein the mapped room response comprises a particular historical room response from a set of historical room responses; and adjusting output of the speaker based on the second acoustic response.

2. The audio playback device of claim 1, wherein the functions further comprise:

receiving, via the network interface from the mobile device, data representing the first spatial location, wherein the first spatial location is set via input on a control application on the mobile device.

3. The audio playback device of claim 1, wherein determining the mapping from the first acoustic response to the corresponding second acoustic response comprises determining respective distances between the first acoustic response and the set of historical room responses.

4. The audio playback device of claim 1, wherein the audio playback device is located within the given environment at a third spatial location, and wherein the functions further comprise:

determining relative positioning between the first spatial location, the second spatial location, and the third spatial location.

5. The audio playback device of claim 1, wherein the data storage of the audio playback device stores one or more state variables representing a current configuration of the audio playback device and wherein determining the mapping from the first acoustic response to a corresponding second acoustic response is further based on the current configuration of the audio playback device.

6. The audio playback device of claim 5, wherein the set of historical room responses is a subset of a global set of historical room responses, and wherein each historical room response in the subset of the global set of historical room responses corresponds to the current configuration of the audio playback device.

7. The audio playback device of claim 5, wherein the one or more state variables comprise an orientation state variable indicating a current orientation of the audio playback device, the current orientation of the audio playback device comprising one of (a) a vertical orientation or (b) a horizontal orientation, and wherein the set of historical room responses represent respective room responses produced by one or more additional audio playback devices in the same orientation as the current orientation of the audio playback device.

8. The audio playback device of claim 5, wherein the one or more state variables comprise a positioning state variable indicating a current positioning of the audio playback device, the current positioning of the audio playback device comprising one of multiple pre-set positions, the multiple pre-set positions comprising (a) a shelf, (b) a floor, and (c) a cabinet, and wherein the set of historical room responses represent respective room responses produced by one or more additional playback devices in the same positioning as the current positioning of the audio playback device.

9. The audio playback device of claim 5, wherein the one or more state variables comprise a synchrony state variable indicating a current synchrony group configuration of the audio playback device, the current synchrony group configuration comprising one of (a) a stereo pair or (b) a surround sound configuration, and wherein the set of historical room responses represent respective room responses produced by one or more additional playback devices in the same synchrony group configuration as the current synchrony group configuration of the audio playback device.

10. A method to be performed by an audio playback device comprising a network interface and a speaker, the method comprising outputting, via the speaker, first audio content;

receiving, via the network interface from a mobile device, data representing one or more reflections of the first audio content in a given environment as captured by a microphone of the mobile device, wherein the mobile device is located within the given environment at a first spatial location, and wherein the microphone is on or proximate to the mobile device;

determining a first acoustic response comprising a microphone response representing an acoustic response of the given environment as measured at the first spatial location within the given environment by the mobile device;

based on the first acoustic response, determining a mapping from the first acoustic response to a corresponding second acoustic response comprising a mapped room response, wherein the second acoustic response approximates an acoustic response of the given environment as measured at one or more second spatial locations, wherein the mapped room response comprises a particular historical room response from a set of historical room responses; and adjusting output of the speaker based on the second acoustic response.

11. The method of claim 10, further comprising:

receiving, via the network interface from the mobile device, data representing the first spatial location, wherein the first spatial location is set via input on a control application on the mobile device.

12. The method of claim 10, wherein determining the mapping from the first acoustic response to the corresponding second acoustic response comprises determining respective distances between the first acoustic response and the set of historical room responses.

13. The method of claim 10, wherein the audio playback device is located within the given environment at a third spatial location, and wherein the method further comprises:

determining relative positioning between the first spatial location, the second spatial location, and the third spatial location.

14. The method of claim 10, wherein a data storage of the audio playback device stores one or more state variables representing a current configuration of the audio playback device and wherein determining the mapping from the first acoustic response to a corresponding second acoustic response is further based on the current configuration of the audio playback device.

15. The method of claim 14, wherein the set of historical room responses is a subset of a global set of historical room responses, and wherein each historical room response in the subset of the global set of historical room responses corresponds to the current configuration of the audio playback device.

16. The method of claim 14, wherein the one or more state variables comprise an orientation state variable indicating a current orientation of the audio playback device, the current orientation of the audio playback device comprising one of (a) a vertical orientation or (b) a horizontal orientation, and wherein the set of historical room responses represent respective room responses produced by one or more additional audio playback devices in the same orientation as the current orientation of the audio playback device.

17. The method of claim 14, wherein the one or more state variables comprise a positioning state variable indicating a current positioning of the audio playback device, the current positioning of the audio playback device comprising one of multiple pre-set positions, the multiple pre-set positions comprising (a) a shelf, (b) a floor, and (c) a cabinet, and wherein the set of historical room responses represent respective room responses produced by one or more additional playback devices in the same positioning as the current positioning of the audio playback device.

18. The method of claim 14, wherein the one or more state variables comprise a synchrony state variable indicating a current synchrony group configuration of the audio playback device, the current synchrony group configuration comprising one of (a) a stereo pair or (b) a surround sound configuration, and wherein the set of historical room responses represent respective room responses produced by one or more additional playback devices in the same synchrony group configuration as the current synchrony group configuration of the audio playback device.

19. A tangible non-transitory computer-readable medium having stored thereon instructions executable by an audio playback device to cause the audio playback device to perform a method comprising:

outputting, via a speaker of the audio playback device, first audio content;

receiving, via a network interface of the audio playback device from a mobile device, data representing one or more reflections of the first audio content in a given environment as captured by a microphone of the mobile device, wherein the mobile device is located within the given environment at a first spatial location, and wherein the microphone is on or proximate to the mobile device;

determining a first acoustic response comprising a microphone response representing an acoustic response of the given environment as measured at the first spatial location within the given environment by the mobile device;

based on the first acoustic response, determining a mapping from the first acoustic response to a corresponding second acoustic response comprising a mapped room response, wherein the second acoustic response approximates an acoustic response of the given environment as measured at one or more second spatial locations, wherein the mapped room response comprises a particular historical room response from a set of historical room responses; and adjusting output of the speaker based on the second acoustic response.

20. The tangible, non-transitory computer-readable medium of claim 19, wherein determining the mapping from the first acoustic response to the corresponding second acoustic response comprises determining respective distances between the first acoustic response and the set of historical room responses.

* * * * *